(12) United States Patent
Omata et al.

(10) Patent No.: US 6,983,521 B2
(45) Date of Patent: Jan. 10, 2006

(54) METHOD OF MANUFACTURING A STRAIN ELEMENT

(75) Inventors: Nobuaki Omata, Kyoto (JP); Atsushi Irie, Ibaraki (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/750,837

(22) Filed: Jan. 5, 2004

(65) Prior Publication Data

US 2004/0135475 A1     Jul. 15, 2004

Related U.S. Application Data

(62) Division of application No. 10/032,463, filed on Jan. 2, 2002, now Pat. No. 6,713,944.

(51) Int. Cl.
*H04R 17/00* (2006.01)
*H01C 17/075* (2006.01)

(52) U.S. Cl. .................... 29/25.35; 29/621.1; 29/846; 427/100; 427/116; 427/117

(58) Field of Classification Search ............... 29/25.35, 29/25.41, 25.42, 605, 606, 846, 829, 621.1; 427/100, 116, 117; 310/328, 367, 369
See application file for complete search history.

(56) References Cited

U.S. PATENT DOCUMENTS

| | | |
|---|---|---|
| 2,497,108 A | 2/1950 | Williams |
| 3,781,955 A | 1/1974 | Lavrinenko et al. |
| 3,798,474 A | 3/1974 | Cassand et al. |
| 3,816,774 A | 6/1974 | Ohnuki et al. |
| 3,900,748 A | 8/1975 | Adler |
| 4,435,667 A | 3/1984 | Kolm et al. |
| 4,638,207 A | 1/1987 | Radice |
| 4,690,143 A | 9/1987 | Schroeppel |
| 4,768,173 A | 8/1988 | Gautier et al. |
| 4,843,275 A | 6/1989 | Radice |
| 4,911,172 A | 3/1990 | Bui et al. |
| 5,109,861 A | 5/1992 | Walinsky et al. |
| 5,112,438 A * | 5/1992 | Bowers ................. 427/116 X |
| 5,526,601 A | 6/1996 | Onuma et al. |

FOREIGN PATENT DOCUMENTS

| | | | |
|---|---|---|---|
| JP | 356131221 A | | 10/1981 |
| JP | 57-15600 | | 1/1982 |
| JP | 57-208798 | | 12/1982 |
| JP | 60-63401 | | 4/1985 |
| JP | 60-264200 | | 12/1985 |
| JP | 1-223785 | * | 9/1989 |
| JP | 04-025640 | | 1/1992 |
| JP | 5-136476 | | 6/1993 |
| JP | 6-22396 | | 1/1994 |
| JP | 6-206787 | * | 7/1994 |
| JP | 06-216424 | | 8/1994 |
| JP | 7-103999 | | 4/1995 |

(Continued)

*Primary Examiner*—A. Dexter Tugbang
(74) *Attorney, Agent, or Firm*—Dickstein Shapiro Morin & Oshinsky LLP

(57) ABSTRACT

The invention relates to a method of manufacturing a strain element. In one aspect, the method of the invention comprises forming a coating film of titanium or a titanium compound on a surface of a cylindrical mold, and shaping the coating film like a coil. The method invention further comprises forming a crystal film of a strain element having a property of a piezoelectric inverse effect by hydrothermal synthesis on the coating film shaped like the coil, and removing the strain element from the cylindrical mold.

4 Claims, 33 Drawing Sheets

FOREIGN PATENT DOCUMENTS

| | | |
|---|---|---|
| JP | 7-307500 | 11/1995 |
| JP | 11-112046 | 4/1999 |
| JP | 11-195819 | 7/1999 |
| JP | 2000-174353 | 6/2000 |
| WO | WO-98-09339 | 3/1998 |
| WO | WO-01-47318 A2 | 6/2001 |

* cited by examiner

Fig. 1
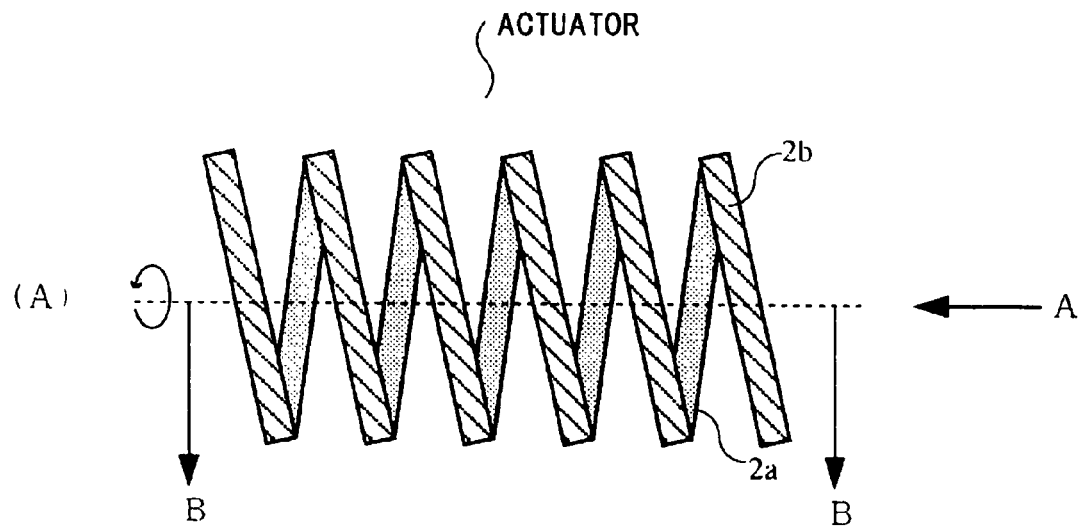
(A)
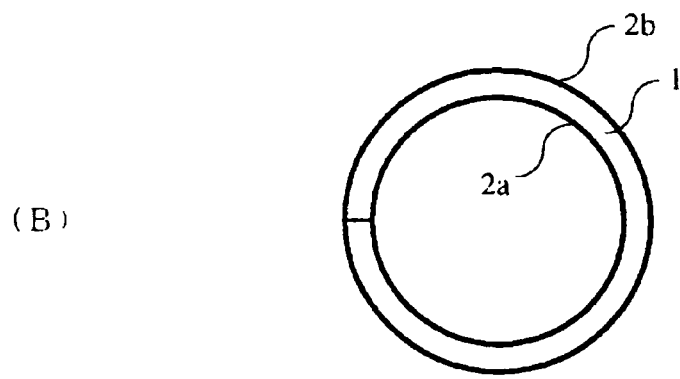
(B)
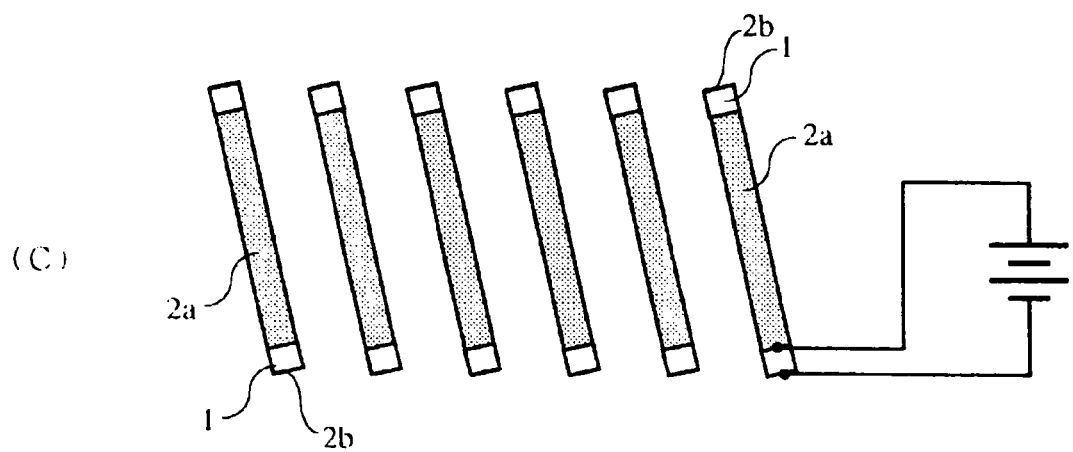
(C)

Fig. 5
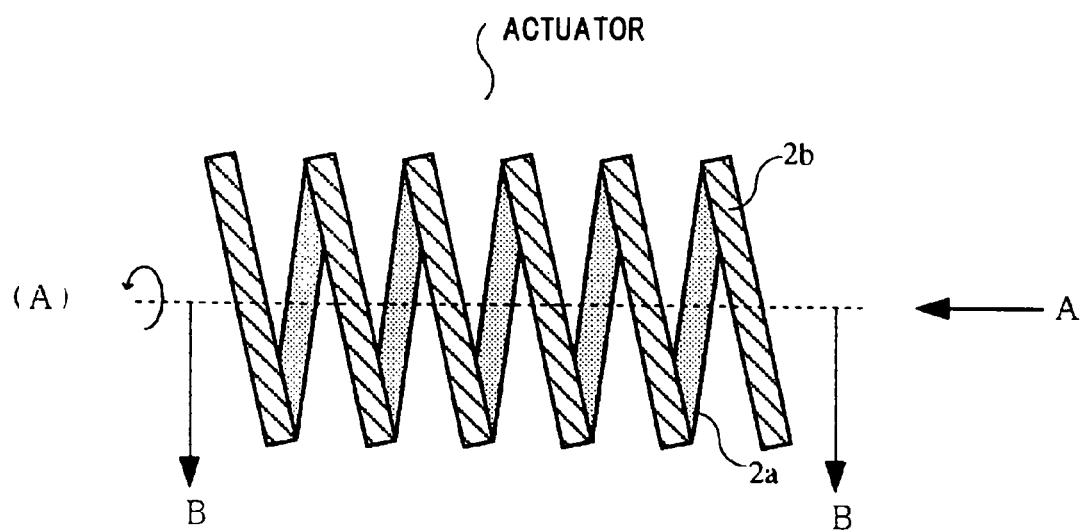
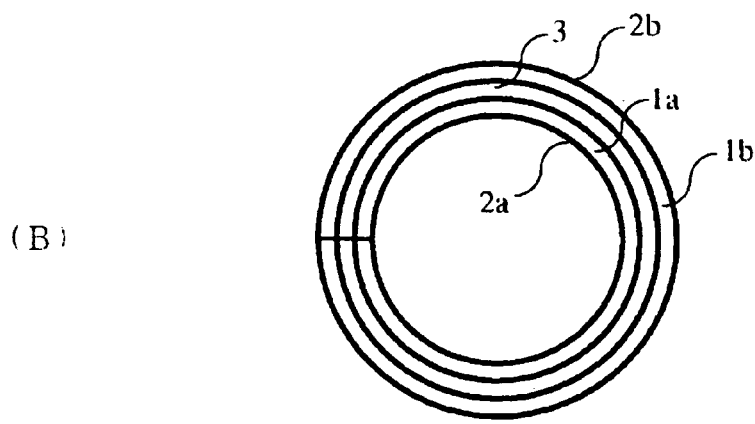
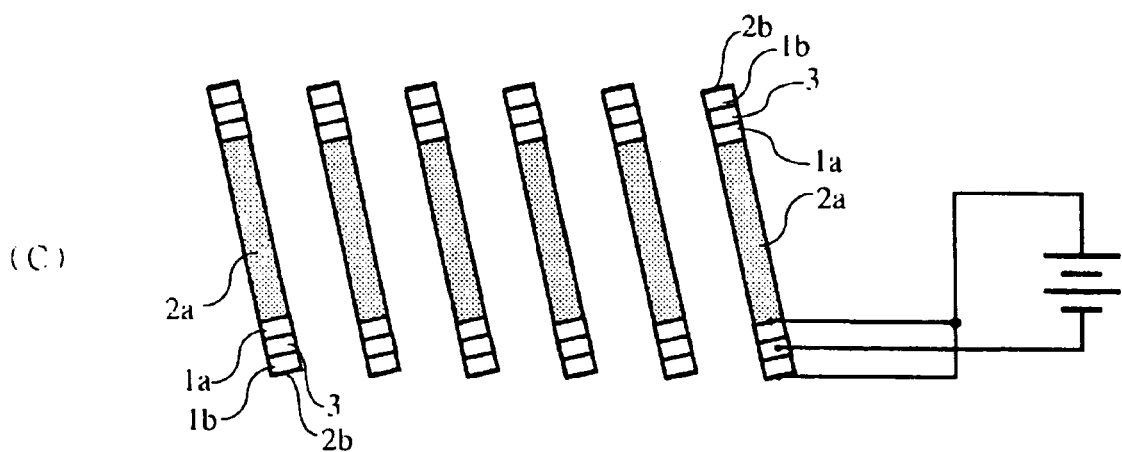

Fig. 13
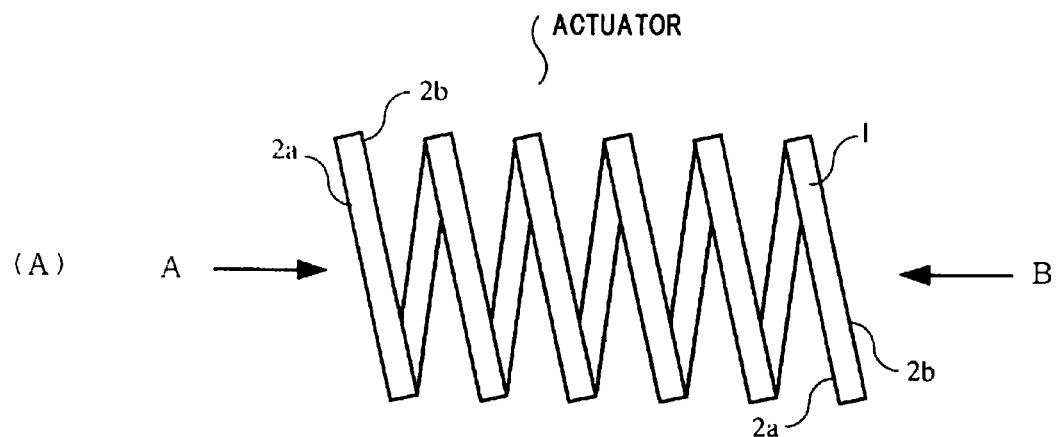
(A)
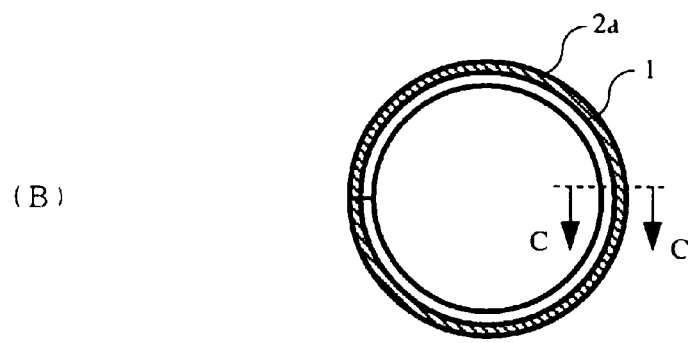
(B)
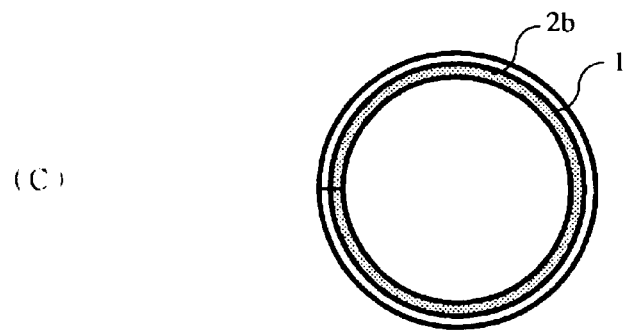
(C)
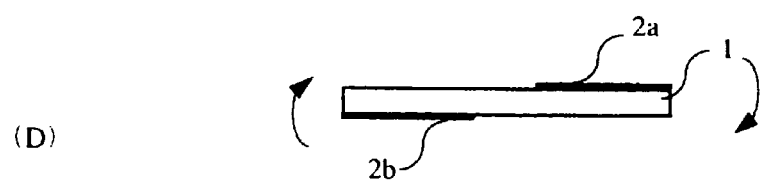
(D)

Fig. 19
(A)
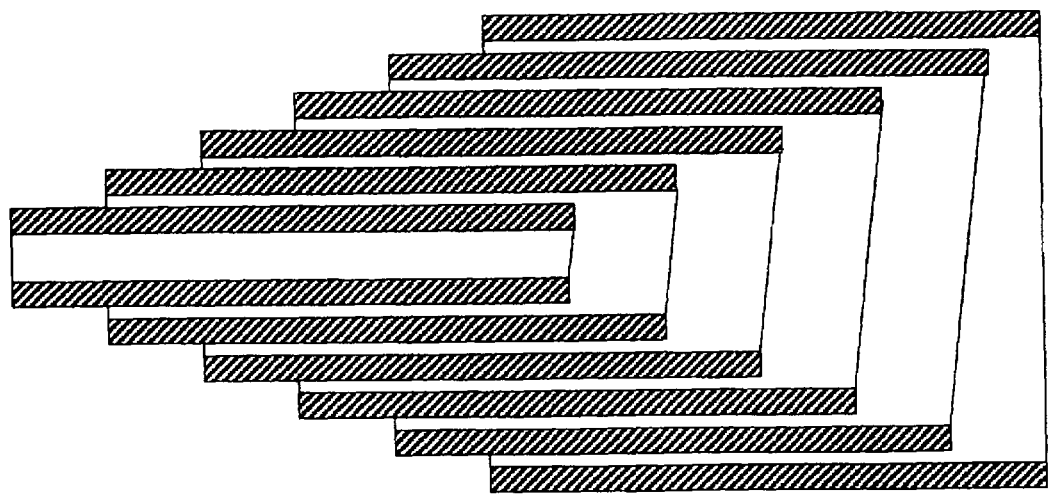
(B)
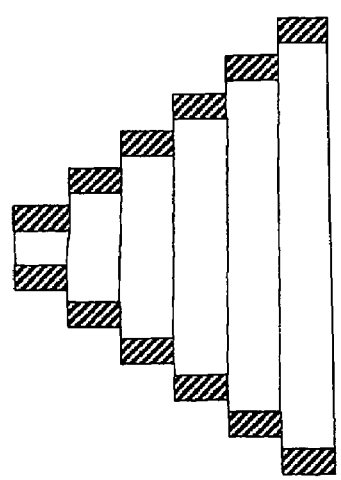

*Fig. 24*
(A)
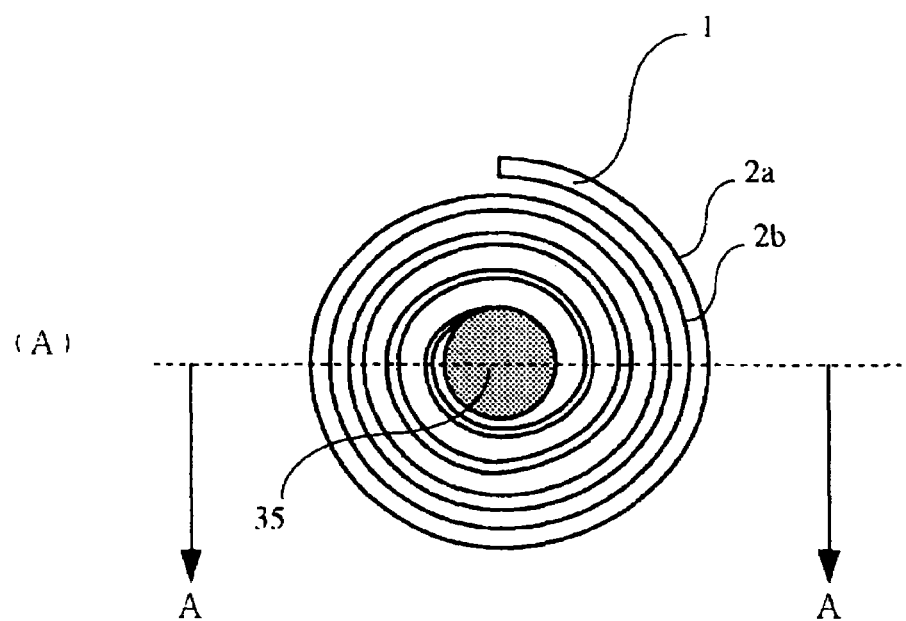
(B)
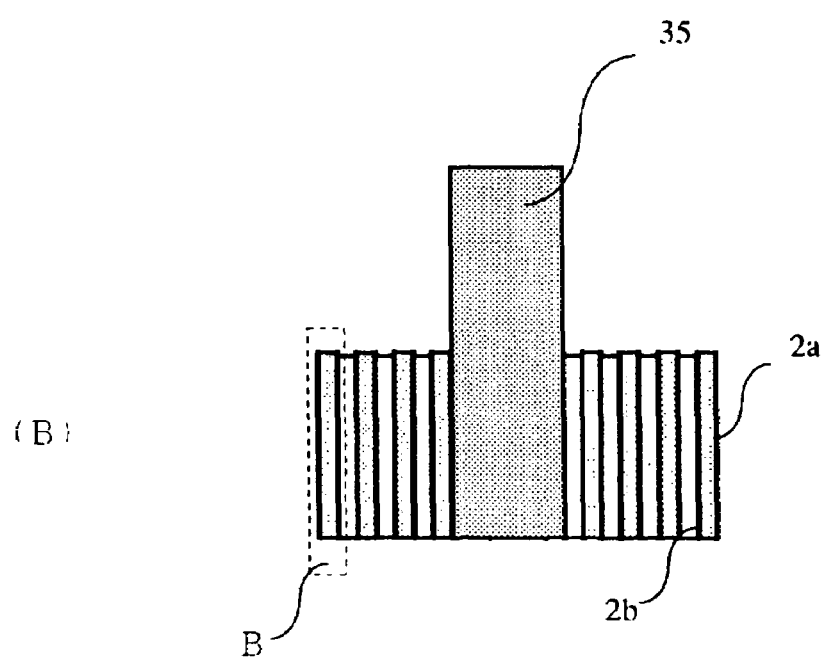

Fig. 25
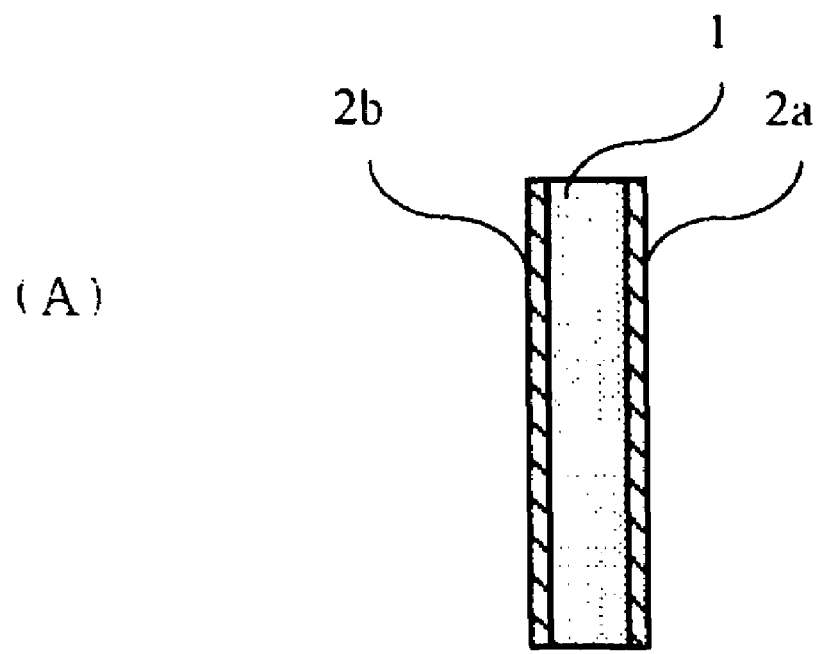
(A)
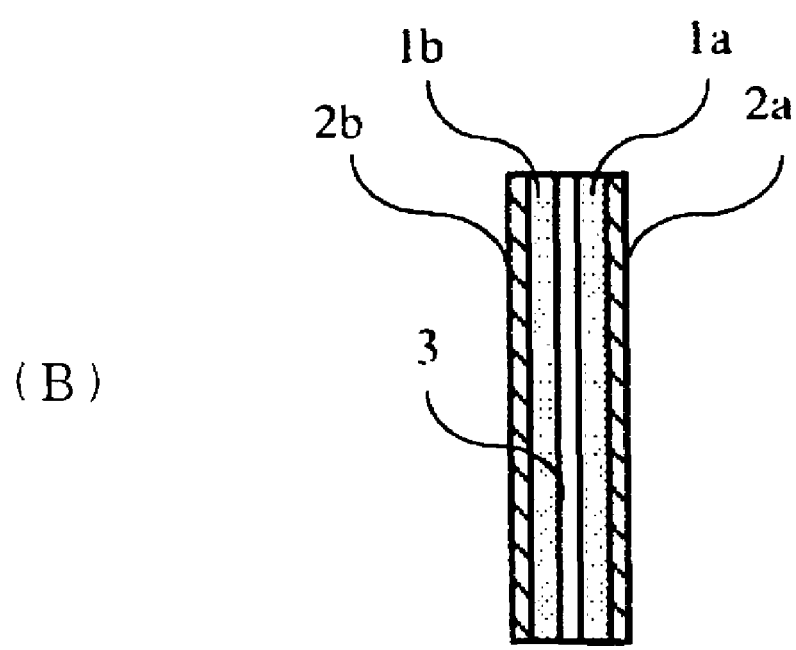
(B)

Fig. 29
(A) 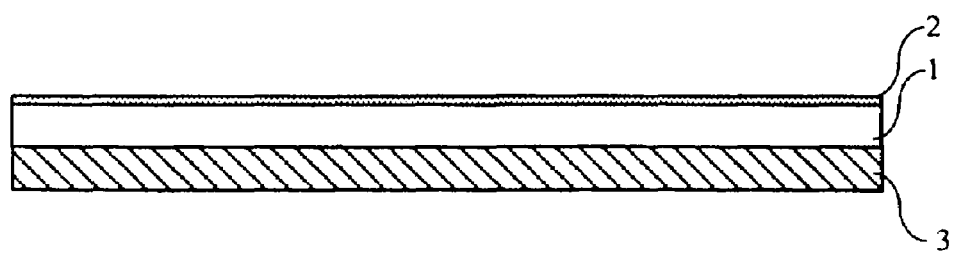
(B) 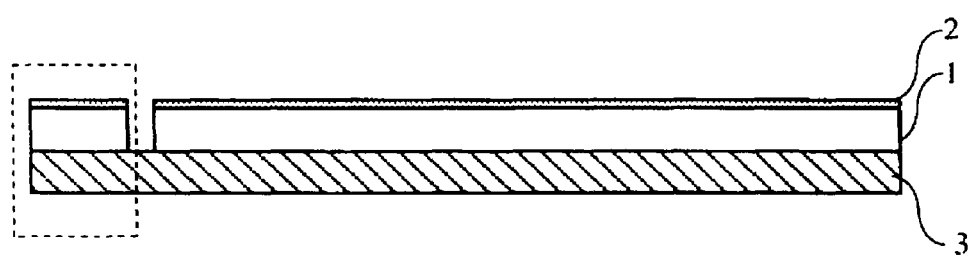
(C) 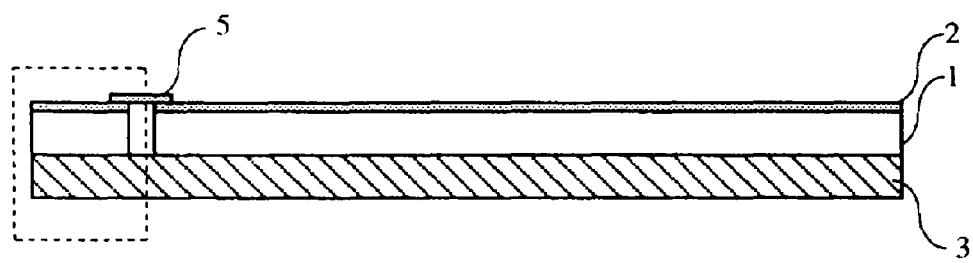

Fig. 32
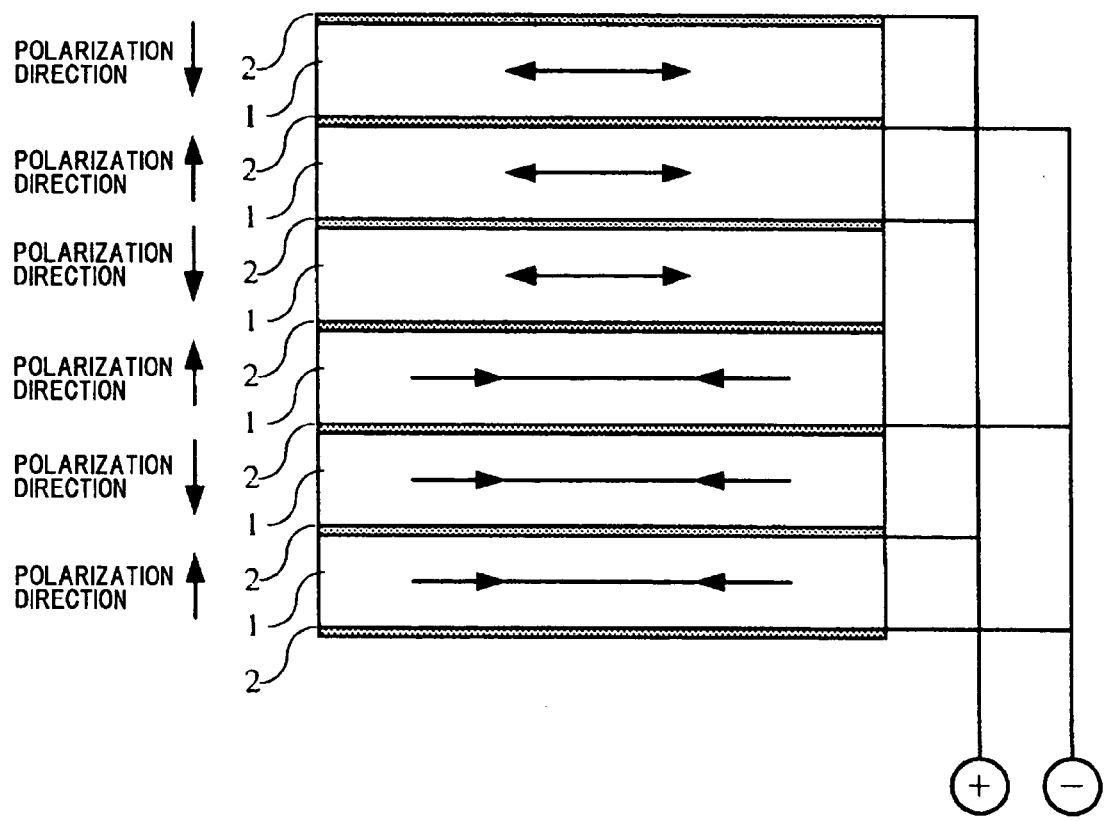
(A)
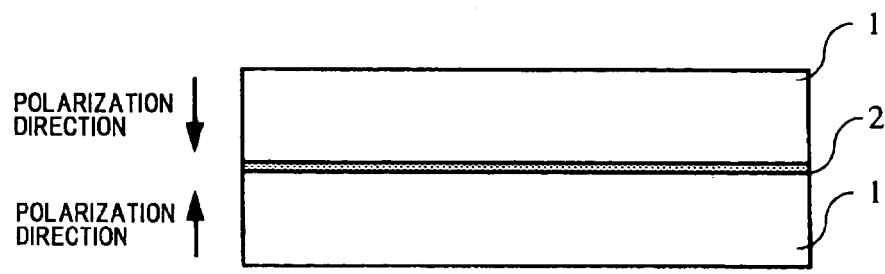
(B)

METHOD OF MANUFACTURING A STRAIN ELEMENT

This is a divisional application of U.S. patent application Ser. No. 10/032,463, filed on Jan. 2, 2002, now U.S. Pat. No. 6,713,944, issued on Mar. 30, 2004, the entire disclosure of which is incorporated herein by reference.

BACKGROUND OF THE INVENTION

1. Field of the Invention

The present invention relates to an actuator using a strain element having such a property that it is deformed when voltage is applied, the so-called piezoelectric inverse effect, and a method of manufacturing the strain element.

2. Description of the Related Art

Conventionally, there has been an actuator using a piezoelectric element having such a property that a strain occurs and a deformation is caused when voltage is applied, the so-called piezoelectric inverse effect. In the actuator using the piezoelectric element, since an amount of deformation (amount of displacement) of the piezoelectric element is small, a mechanism portion (displacement enlargement mechanism portion) for enlarging the amount of displacement must be provided, and there has been a problem that its main body becomes large, and a problem that it takes labor to assemble the displacement enlargement mechanism portion.

Incidentally, the displacement enlargement mechanism portion is, as disclosed in Japanese Patent Unexamined Publication No. Hei. 4-25640, a mechanical enlargement mechanism portion employing the principle of leverage, a liquid type enlargement mechanism portion employing Pascal's principle, or the like.

Recently, an actuator in which the displacement enlargement mechanism portion is constructed by an actuator itself is proposed (Japanese Patent Unexamined Publication No. Hei. 6-216424). This actuator is constructed such that a belt-shaped piezoelectric element is helically wound over the full length of a hollow coil spring. According to this actuator, when voltage is applied to the piezoelectric element, a torsion moment by the deformation of the piezoelectric element acts on the full length of the coil spring, so that the coil spring is displaced in the axial direction. The amount of displacement of the coil spring in the axial direction can be made large if the number of turns of the coil spring is increased.

However, the actuator is assembled by helically winding the belt-shaped piezoelectric element over the full length of the hollow coil spring, and the step of helically winding the belt-shaped piezoelectric element is a very troublesome step, so that manufacturing costs are raised and the actuator is expensive.

SUMMARY OF THE INVENTION

An object of the present invention is to provide a small and inexpensive actuator which has a simple structure and can obtain a large displacement, and a method of manufacturing a strain element applied to the actuator.

The actuator of the present invention has the following structure to solve the above problem.

(1) An actuator comprises a strain element having a property of a piezoelectric inverse effect, in which the strain element is wound like a coil, and electrodes are formed on an inner circumferential surface and an outer circumferential surface.

According to this structure, when voltage is applied between the electrodes formed on the inner circumferential surface and the outer circumferential surface, the strain element wound like the coil is displaced in a direction to contract or expand the diameter of the coil. At this time, if one end portion of the strain element wound like the coil is fixed, the other end portion, which is not fixed, is rotated in accordance with the contraction or expansion of the diameter. The rotation direction at this time is determined by the winding direction of the strain element, and the rotation amount of the other end portion is determined by the number of turns of the strain element or the like.

Accordingly, since the displacement of sufficient magnitude can be easily obtained by adjusting the number of turns or the like, a displacement enlargement mechanism portion is also not required.

Besides, the strain element having the shape wound like the coil can be easily formed by extrusion molding or the like, and formation of the electrodes on the inner circumferential surface and the outer circumferential surface of the strain element can be easily carried out by a well-known processing method such as a printing or plating method. Accordingly, the actuator of this invention does not require a troublesome step in its manufacturing process and can be formed inexpensively.

(2) An actuator comprises a strain element having a property of a piezoelectric inverse effect, in which a metal coil wound like a coil is provided, the strain element is formed on at least one of an inner circumferential surface and an outer circumferential surface of the metal coil, and an electrode is formed on a surface of the strain element.

According to this structure, the strain element is formed on one of or both of the inner circumferential surface and the outer circumferential surface of the metal coil wound like the coil. The electrode is formed on the surface of the strain element. When voltage is applied between the electrode and the metal coil, in accordance with the displacement of the strain element, the metal coil is deformed in a direction to contract or expand the diameter of the coil. Accordingly, similarly to the above structure (1), if one end portion of the metal coil is fixed, the other end portion which is not fixed is rotated.

Besides, when well-known hydrothermal synthesis is used, the strain element can be easily formed on the outer circumferential surface or the inner circumferential surface of the metal coil wound like the coil. Besides, formation of the electrode on the surface of the strain element (the surface here is a surface at a side opposite to a contact surface to the metal coil) can also be easily performed by a well-known method such as a printing or plating method.

Incidentally, as compared with a case where the strain element is formed on only one of the inner circumferential surface and the outer circumferential surface of the metal coil wound like the coil, when the strain element is formed on both the inner circumferential surface and the outer circumferential surface, the displacement of the metal coil becomes large, so that further miniaturization can be realized.

(3) An actuator provided with a strain element having a property of a piezoelectric inverse effect, in which the strain element is wound like a coil, an electrode having a width narrower than a width of the strain element is formed on an upper surface of the strain element along a side portion of one of an inner circumferential side and an outer circumferential side, and an electrode having a width narrower than the width of the strain element is formed on a lower surface of the strain element along a side portion of an opposite side of that of the upper surface.

According to this structure, the electrode having the width narrower than the strain element is formed on the upper surface of the strain element wound like the coil along the side portion of one of the inner circumferential side and the outer circumferential side, and the electrode having the width narrower than the strain element is formed on the lower surface of the strain element along the side portion of the opposite side of that of the upper surface. With respect to two electrodes arranged side by side, since a desirable shape is such that all of them are formed on the strain element, it is appropriate that the width of the electrode is made not larger than half of the width of the strain element. However, even if the electrode has a size exceeding the half so that it protrudes to the outside or inside of the strain element, there does not especially arise a problem.

When voltage is applied between the electrodes formed on the upper surface and the lower surface of the strain element, distortion is generated over the full length of the strain element wound like the coil, and displacement occurs in the axial direction. Since the displacement amount in the axial direction at this time can be adjusted by the number of turns of the strain element or the like, the displacement amount of sufficient magnitude can be easily obtained.

Besides, as described above, the strain element wound like the coil can be easily formed by the extrusion molding or the like, and the formation of the electrodes on the inner circumferential surface and the outer circumferential surface of the strain element can also be easily carried out by the printing, plating method or the like.

(4) An actuator provided with a strain element having a property of a piezoelectric inverse effect, in which a metal coil wound like a coil is provided, a strain element having a width narrower than a width of the metal coil is formed on an upper surface of the metal coil along a side portion of one of an inner circumferential side and an outer circumferential side, a strain element having a width narrower than the width of the metal coil is formed on a lower surface of the metal coil along a side portion of an opposite side of that of the upper surface, and electrodes are formed on surfaces of the strain elements.

According to this structure, the strain element having the width narrower than the width of the metal coil is formed on the upper surface of the metal coil along the side portion of one of the inner circumferential side and the outer circumferential side, and the strain element having the width narrower than the width of the metal coil is formed on the lower surface of the metal coil along the side portion of the opposite side of that of the upper surface. The electrodes are formed on the surfaces of the strain elements formed on the upper surface and the lower surface of the metal coil, respectively.

When voltage is applied between the electrode and the metal coil, distortion is generated in the metal coil, and the metal coil is displaced in the axial direction. Since the displacement amount in the axial direction at this time can be adjusted by the number of turns of the metal coil or the like, the displacement amount of sufficient magnitude can be easily obtained.

Besides, as described above, if the well-known hydrothermal synthesis is used, the strain elements can be easily formed on the outer circumferential surface and the inner circumferential surface of the metal coil wound like the coil. Besides, the formation of the electrode on the surface of the strain element (the surface here is a surface at a side opposite to a contact surface to the metal coil) can be easily carried out by the well-known method such as printing or plating method.

(5) An actuator provided with a strain element having a property of a piezoelectric inverse effect, in which a metal coil wound like a coil is provided, two belt-shaped strain elements each having a width of not larger than half of a width of the metal coil are formed side by side on at least one of an upper surface and a lower surface of the metal coil, and electrodes are formed on surfaces of the strain elements.

According to this structure, the two belt-shaped strain elements each having the width of not larger than half of the metal coil are formed side by side on one of or both of the upper surface and the lower surface of the metal coil. Besides, the electrodes are formed on the surfaces of the strain elements. Here, if the polarization directions of the two strain elements formed side by side are made opposite to each other, when voltage is applied between the electrode and the metal coil, distortion is generated in the metal coil, and the metal coil is displaced in the axial direction.

Besides, as compared with a case where two strain elements are formed side by side only on one of the upper surface and the lower surface of the metal coil, when two strain elements are formed side by side on both of the upper surface and the lower surface of the metal coil, the distortion generated when voltage is applied becomes large, so that further miniaturization of the actuator can be realized. Incidentally, the polarization directions of the two strain elements formed side by side on the upper surface and the lower surface are opposite to each other, the polarization directions of the strain element on the upper surface at the outer circumferential side and the strain element on the lower surface at the inner circumferential side are opposite to each other, and the polarization directions of the strain element on the upper surface at the inner circumferential side and the strain element on the lower surface at the outer circumferential side are also opposite to each other.

(6) An actuator provided with a strain element having a property of a piezoelectric inverse effect, in which the strain element is wound like a coil, an electrode having a height lower than a height of the strain element is formed on an inner circumferential surface of the strain element along an end portion of one of an upper end and a lower end, and an electrode having a height lower than the height of the strain element is formed on an outer circumferential surface of the strain element along an opposite end portion of that of the inner circumferential surface.

(7) An actuator provided with a strain element having a property of a piezoelectric inverse effect, in which a metal coil wound like a coil is provided, a strain element having a height lower than a height of the metal coil is formed on an inner circumferential surface of the metal coil along an end portion of one of an upper end and a lower end, a strain element having a height lower than the height of the metal coil is formed on an outer circumferential surface of the metal coil along an opposite end portion of that of the inner circumferential surface, and electrodes are formed on surfaces of the strain elements.

(8) An actuator provided with a strain element having a property of a piezoelectric inverse effect, in which a metal coil wound like a coil is provided, two belt-shaped strain elements each having a height of not larger than half of a height of the metal coil are formed side by side on at least one of an inner circumferential surface and an outer circumferential surface of the metal coil, and electrodes are formed on surfaces of the strain elements.

While the strain elements and the electrodes are formed on the upper surface and the lower surface in the structures (3) to (5), they are formed on the inner circumferential surface and the outer circumferential surface in the structures (6) to (8), and the same effects as those of the structures (3) to (5) can be obtained.

(9) An actuator provided with a strain element having a property of a piezoelectric inverse effect, in which the strain element is belt-shaped, an electrode having a width narrower than a width of the strain element is formed on one surface of the strain element along one side portion, and an electrode having a width narrower than the width of the strain element is formed on the other surface of the strain element along the other side portion.

(10) An actuator provided with a strain element having a property of a piezoelectric inverse effect, in which a belt-shaped metal plate is provided, a strain element having a width narrower than a width of the metal plate is formed on one surface of the metal plate along one side portion, a strain element having a width narrower than the width of the metal plate is formed on the other surface of the metal plate along the other side portion, and electrodes are formed on surfaces of the strain elements.

(11) An actuator provided with a strain element having a property of a piezoelectric inverse effect, in which a belt-shaped metal plate is provided, two belt-shaped strain elements each having a width of not larger than half of the metal coil are formed side by side on at least one surface of the metal plate, and electrodes are formed on surfaces of the strain elements.

In the structures (9) to (11), the coil-shaped strain elements or the coil-shaped metal coils of the structures (3) to (8) are replaced by the belt-shaped strain elements or the belt-shaped metal plates.

(12) An actuator provided with a strain element having a property of a piezoelectric inverse effect, in which both end portions of the strain element are spirally wound, and electrodes are formed on an inner circumferential surface and an outer circumferential surface.

(13) An actuator provided with a strain element having a property of a piezoelectric inverse effect, in which a metal coil having both ends spirally wound, the strain element is formed on at least one of an inner circumferential surface and an outer circumferential surface of the metal coil, and an electrode is formed on a surface of the strain element.

In the structures (12) and (13), since both the ends are spirally wound, when voltage is applied, a displacement can be generated at both the ends.

(14) An actuator provided with a strain element having a property of a piezoelectric inverse effect, in which the strain element is spirally wound, electrodes are formed on an inner circumferential surface and an outer circumferential surface, and a dielectric is provided in parallel with the strain element.

(15) An actuator provided with a strain element having a property of a piezoelectric inverse effect, in which a spirally wound metal coil is provided, the strain element is formed on at least one of an inner circumferential surface and an outer circumferential surface of the metal coil, an electrode is formed on a surface of the strain element, and a dielectric is provided in parallel with the strain element.

According to the structures (14) and (15), since the dielectric connected in parallel with the strain element is provided, when application of voltage to the strain element is turned off, a return to an initial state of the strain element can be restricted by using electric charges stored in the dielectric.

(16) A dielectric is provided in parallel with the strain element.

According to this structure, as described above, the return to the initial state of the strain element can be restricted by using the electric charges stored in the dielectric.

(17) The strain element is a laminated strain element.

According to this structure, since the laminated strain element is used, each piezoelectric element can be made thin. In a bimorph type piezoelectric element, as the thickness becomes small, the displacement becomes large, and the force generated by the displacement becomes weak. Since the plurality of piezoelectric elements are laminated, a large force can be generated when voltage is applied, and a large displacement can be obtained. Accordingly, the actuator can be constructed to be still smaller.

Besides, a method of manufacturing a strain element according to the present invention comprises the following steps.

(1) A coating film of titanium or a titanium compound is formed on a surface of a cylindrical mold, the coating film formed on the surface of the cylindrical mold is shaped like a coil, a crystal film of a strain element having a property of a piezoelectric inverse effect is formed on the coating film shaped like the coil by hydrothermal synthesis, and the strain element is removed from the cylindrical mold.

According to the method of manufacturing the strain element, the crystal film of the strain element is formed by the hydrothermal synthesis on the coating film of the titanium or the titanium compound shaped like the coil on the surface of the cylindrical mold. Accordingly, by removing it from the mold, the strain element can be manufactured into the coil shape. An actuator wound like the coil can be manufactured by forming an electrode on this strain element.

Besides, the coating film of the titanium or the titanium compound is formed on an inner circumferential surface of the removed strain element, and this film functions as an electrode.

(2) A crystal film of a strain element having a property of a piezoelectric inverse effect is formed by hydrothermal synthesis on an inner circumferential surface of the strain element removed from the cylindrical mold, so that laminated coil-shaped strain elements can be manufactured between which the film of the titanium or the titanium compound functioning as the electrode is interposed.

(3) A coating film of titanium or a titanium compound is formed on an outer circumferential surface of the strain element removed from the cylindrical mold, a crystal film of a strain element having a property of a piezoelectric inverse effect is formed by hydrothermal synthesis on the coating film formed on the outer circumferential surface of the strain element, so that similarly to the method (2), laminated coil-shaped strain elements can be manufactured between which the film of the titanium or the titanium compound functioning as the electrode is interposed.

(4) A hydrophilic region is formed into a coil shape on a surface of a cylindrical mold made of a water-repellent resin as a base material, the cylindrical mold is dipped in a solution containing suspended fine particles of a strain element having a property of a piezoelectric inverse effect, the cylindrical mold is pulled up, and the adherent strain element is removed from the cylindrical mold.

According to the above manufacturing method, since the fine particles of the strain element adhere to the hydrophilic region formed into the coil shape on the surface of the cylindrical mold, the strain element wound like the coil can be manufactured by removing them from the mold.

(5) A water-repellent treatment is performed so that a hydrophilic region is formed into a coil shape on a surface of a cylindrical mold made of a hydrophilic resin as a base material, the cylindrical mold is dipped in a solution containing suspended fine particles of a strain element having a property of a piezoelectric inverse effect, the cylindrical mold is picked up, and the adherent strain element is removed from the cylindrical mold.

According to the above manufacturing method as well, similarly to the method (4), since the fine particles of the strain element adhere to the hydrophilic region formed into the coil shape on the surface of the cylindrical mold, the strain element wound like the coil can be manufactured by removing them from the mold.

(6) A hot isostatic press is performed to the cylindrical mold before the adherent strain element is removed from the cylindrical mold, so that the fine particles of the strain element adhering to the hydrophilic region is firmly fixed.

(7) An electrode is formed on at least one of an obverse surface and a reverse surface of the strain element removed from the cylindrical mold, this is again dipped in the solution containing the suspended fine particles of the strain element having the piezoelectric inverse effect, and is pulled up, so that a laminated coil-shaped strain element including the interposed electrode can be manufactured.

(8) While fine particles of a strain element having a piezoelectric inverse effect are laminated in a vessel, laser light is irradiated to melt and sinter the fine particles of the strain element, so that strain elements of various shapes, such as a strain element wound like a coil, or a strain element wound like a spring, can be manufactured.

BRIEF DESCRIPTION OF THE DRAWINGS

FIGS. 1A to 1C are views showing an actuator of an embodiment of the present invention.

FIGS. 5A to 5C are views showing an actuator of another embodiment of the present invention.

FIGS. 13A to 13D are views showing an actuator of another embodiment of the present invention.

FIGS. 19A and 19B are views showing a sectional shape of a bamboo spring.

FIGS. 24A and 24B are views showing an actuator of another embodiment of the present invention.

FIGS. 25A and 25B are views showing an actuator of another embodiment of the present invention.

FIGS. 29A to 29C are views for explaining a manufacturing process of an actuator of another embodiment of the present invention.

FIGS. 32A and 32B are views showing a laminated piezoelectric ceramic.

DETAILED DESCRIPTION OF THE PREFERRED EMBODIMENTS

Figure 2:
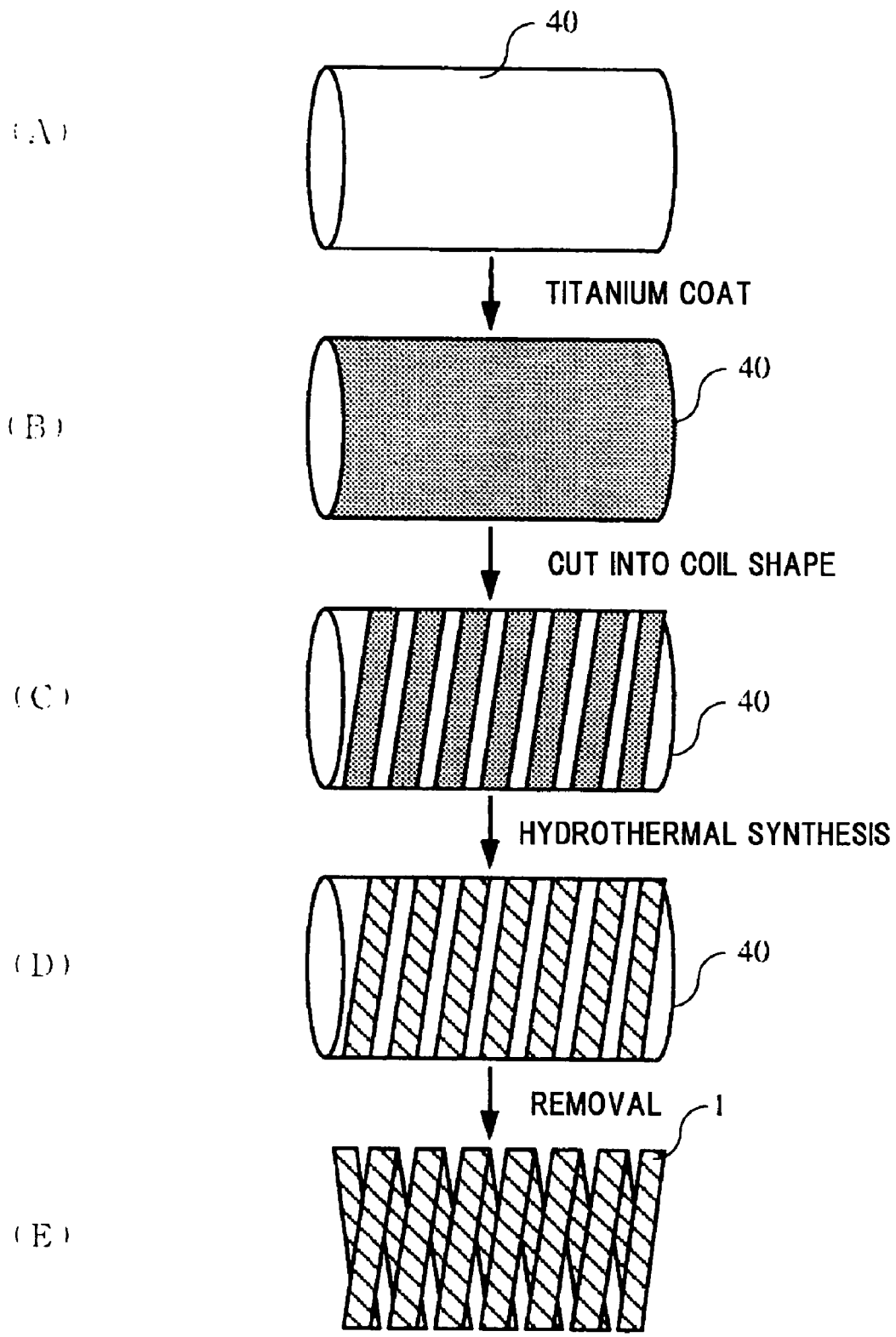
FIGS. 2A to 2E are views for explaining a manufacturing process of a coil-shaped piezoelectric ceramic applied to the actuator of the embodiment of the present invention.
Figure 3:
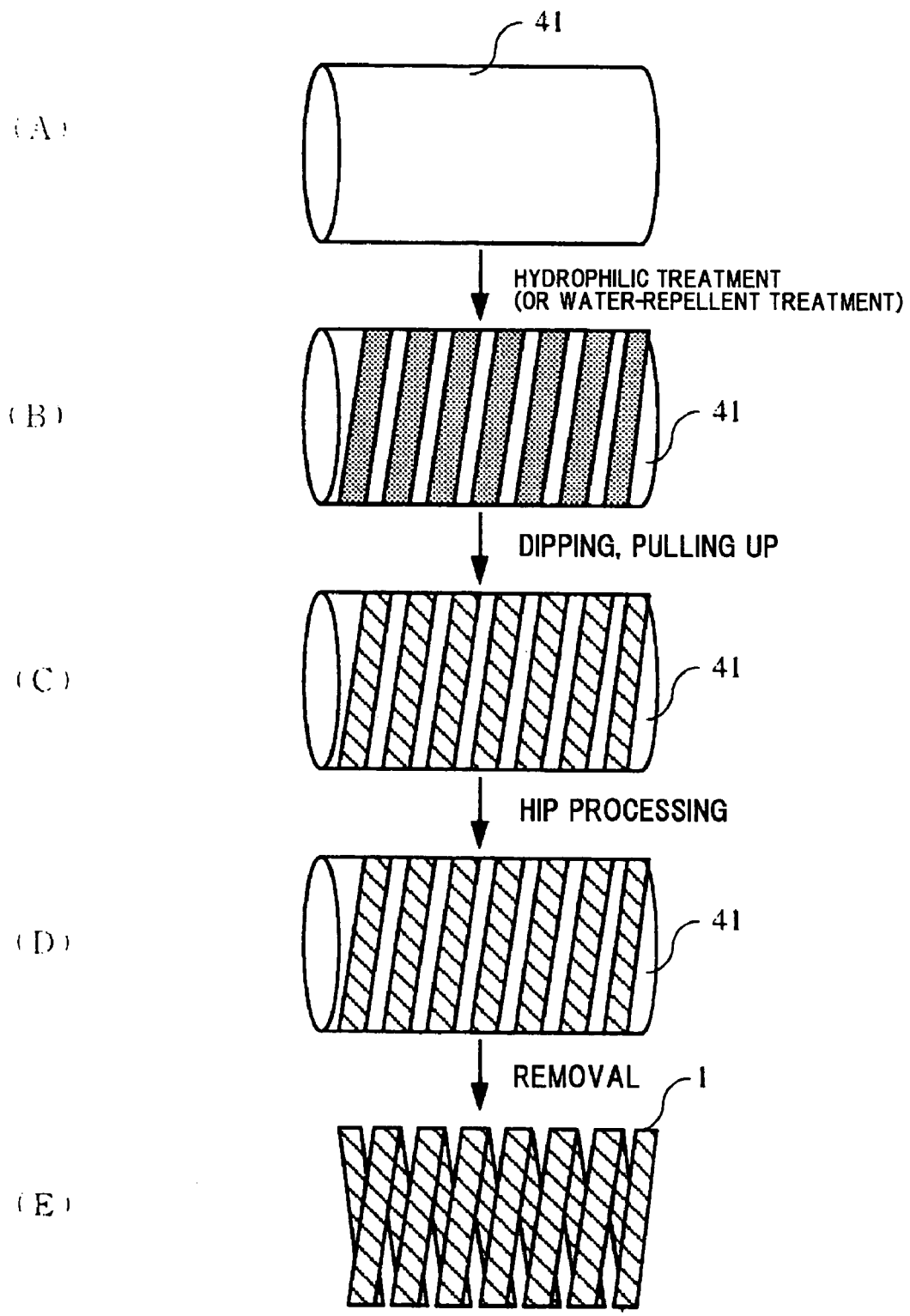
FIGS. 3A to 3E are views for explaining a manufacturing process of a coil-shaped piezoelectric ceramic applied to the actuator of the embodiment of the present invention.

Hereinafter, embodiments of the present invention will be described. FIGS. 1A to 1C are views showing an outer appearance of an actuator of an embodiment of the present invention. FIG. 1A is a front view, FIG. 1B is a view seen in a direction "A" shown in FIG. 1A, and FIG. 1C is a sectional view taken in a direction B—B shown in FIG. 1A. The actuator of this embodiment is such that as shown in the drawing, a piezoelectric ceramic 1 as a strain element is wound like a coil, and electrodes 2 (2a, 2b) are formed on an inner circumferential surface and an outer circumferential surface of the piezoelectric ceramic 1. The piezoelectric ceramic 1 is subjected to a well-known polarization treatment and the orientation of crystal is adjusted such that when voltage is applied between the electrodes 2a and 2b formed on the inner circumferential surface and the outer circumferential surface (positive voltage is applied to the electrode 2a, and negative voltage is applied to the electrode 2b) (see FIG. 1C), an inner circumferential side is contracted and an outer circumferential side is expanded.

Incidentally, the piezoelectric ceramic 1 may be made of lead zirconate titanate (PZT) series, or may be made of barium titanate series, lead titanate series, or the like. Besides, it may be made of high molecular piezoelectric material such as polyvinylidene fluoride (PVDF).

Next, a manufacturing process of the actuator of this embodiment will be described. First, the piezoelectric ceramic 1 is shaped like a coil. For example, a raw material having viscosity higher than slurry and lower than a green sheet is used and it may be shaped like the coil by well-known extrusion molding, or the raw material is poured into a mold and it may be shaped like the coil. After the piezoelectric ceramic 1 is shaped like the coil, the shaped piezoelectric ceramic 1 is sintered (so-called firing process is performed). Next, the electrodes 2a and 2b are formed on the inner circumferential surface and the outer circumferential surface of the sintered coil-shaped piezoelectric ceramic 1. The electrodes 2a and 2b are formed over substantially the full length of the piezoelectric ceramic 1 by well-known processing, for example, a printing or plating method. When formation of the electrodes 2a and 2b is completed, the orientation of the crystal is adjusted by performing a polarization treatment in which high voltage is applied between the electrodes 2a and 2b while the piezoelectric ceramic 1 is heated up to about 130° C. When the polarization treatment is completed, finally, aging is performed in which temperature of the piezoelectric ceramic 1 is lowered to about 80° C. and heating is performed. By the above process, the actuator including the piezoelectric ceramic 1 wound like the coil can be manufactured.

The coil-shaped piezoelectric ceramic may be manufactured by a following method.

FIGS. 2A to 2E are views showing a manufacturing process of a coil-shaped piezoelectric ceramic. A cylindrical mold 40 is used in the manufacture of the piezoelectric ceramic (see FIG. 2A). The cylindrical mold 40 is made of a low surface energy material such as fluorine or polytetrafluoroethylene. Titanium is coated on the whole surface of the cylindrical mold 40 shown in FIG. 2A (titanium coating is performed) (see FIG. 2B). The film thickness of a titanium coat coated on the surface of the cylindrical mold 40 is 5 to 30 μm.

Next, the titanium coat coated on the whole surface of the cylindrical mold 40 is shaped like a coil (see FIG. 2C). The titanium coat coated on the whole surface of the mold 40 can be shaped like the coil by a well-known etching or laser cut (cutting into the coil shape by irradiation of laser light). When the titanium coat is shaped like the coil on the surface of the mold 40, a piezoelectric ceramic film, for example, a PZT film is deposited by hydrothermal synthesis on the titanium coat film shaped like the coil (see FIG. 2D).

The hydrothermal synthesis is, as well known, a crystal growth method performed in high temperature water, especially in high temperature and high pressure water. The thickness of the piezoelectric ceramic film deposited by the hydrothermal synthesis is about 10 μm. The treatment temperature of the hydrothermal synthesis is 150° C.

Since the piezoelectric ceramic film is deposited by the hydrothermal synthesis on the titanium coat shaped like the coil, it is deposited into the coil shape. The piezoelectric ceramic film deposited into the coil shape is removed from the mold 40 (see FIG. 2E). By this, the coil-shaped piezoelectric ceramic 1 can be manufactured. The coil-shaped piezoelectric ceramic 1 can be easily removed from the mold 40 by dissolving the mold 40 by a designated solvent.

An electrode 2 is formed on an outer circumferential surface of the coil-shaped piezoelectric ceramic removed here, so that a coil-shaped actuator is manufactured.

Incidentally, a polarization treatment may be carried out as the need arises. Besides, the titanium coat film coated on the surface of the mold 40 remains on an inner circumferential surface of the piezoelectric ceramic 1, and can be used as the electrode 2.

Besides, when the piezoelectric ceramic 1 removed from the mold 40 is again subjected to the hydrothermal synthesis, the piezoelectric ceramic 1 can be deposited on the titanium coat film of the inner circumferential surface. By this, a laminated coil-shaped piezoelectric ceramic (piezoelectric ceramic of two layers) can be manufactured.

Further, after a titanium coat (thickness of 5 to 30 μm) is formed on the whole outer circumferential surface of the coil-shaped piezoelectric ceramic removed from the mold 40, when a piezoelectric ceramic film is deposited by the hydrothermal synthesis, a laminated piezoelectric ceramic of three or more layers can be manufactured.

As stated above, in the method of manufacturing the coil-shaped piezoelectric ceramic 1 using the mold 40, since the thickness of the titanium base member can be suppressed to 5 to 30 μm, an impeding force at the time of deformation of the actuator is low. Besides, since the coil-shaped piezoelectric ceramic 1 of laminate structure can be manufactured, it is possible to realize the actuator in which the displacement is large and the force generated by the displacement is also large. Further, if the piezoelectric ceramic 1 deposited by the hydrothermal synthesis is not removed from the mold 40, transportation in which the shape of the piezoelectric ceramic 1 is held can be easily performed.

Incidentally, the film coated on the whole surface of the mold 40 may be made of a titanium compound containing titanium as its main ingredient.

Besides, although the method of manufacturing the coil-shaped piezoelectric ceramic 1 by using the hydrothermal synthesis has been described, the coil-shaped piezoelectric ceramic can also be manufactured by a method described below.

FIGS. 3A to 3E are views showing a manufacturing process of a coil-shaped piezoelectric ceramic. The manufacturing method of the piezoelectric ceramic also uses a cylindrical mold 41 (see FIG. 3A). This cylindrical mold 41 is made of a water-repellent or hydrophilic raw material. A coil-shaped hydrophilic region is formed on the surface of the cylindrical mold 41 shown in FIG. 3A (see FIG. 3B). For example, if the raw material of the mold 41 is water-repellent, laser light, ultraviolet light or the like is irradiated to the coil-shaped region formed on the surface of the mold 41 to make the portion hydrophilic. On the other hand, if the mold 41 is made of a hydrophilic raw material, laser light, ultraviolet light, or the like is irradiated to a portion other than the coil-shaped region formed on the surface of the mold 41 to make the portion water-repellent.

Next, the mold 41 in which the hydrophilic region is shaped like the coil is dipped in an alcohol solution in which fine particles of piezoelectric ceramic, such as PZT, are suspended, and is pulled up from the alcohol solution (see FIG. 3C). In the mold 41 dipped in the alcohol solution, the alcohol solution (suspension liquid) in which fine particles of piezoelectric ceramic are suspended adheres to the hydrophilic region, and this suspension liquid does not adhere to the water-repellent region. Accordingly, the fine particles of piezoelectric ceramic adhere to the mold 41 pulled up from the suspension liquid in the coil shape.

After the mold 41 pulled up from the suspension liquid is dried, in order to bond the particles of the piezoelectric ceramic adhering to the mold 41 to one another, the so-called HIP processing (hot pressure processing) is performed (see FIG. 3D). In the HIP processing, liquid is filled in a vessel resistant to high pressure, a rubber vessel containing the mold 41 is put therein, and high temperature and high pressure are applied to the liquid to compress the fine particles of piezoelectric ceramic adhering to the surface of the mold 41, so that the particles are bonded to one another.

After the HIP processing, the piezoelectric ceramic shaped like the coil is removed from the mold 41 (see FIG. 3E). By this, the coil-shaped piezoelectric ceramic 1 is manufactured. The coil-shaped piezoelectric ceramic 1 can be easily removed from the mold 41 by dissolving the mold 41 by a designated solvent.

The thickness of the coil-shaped piezoelectric ceramic manufactured here can be adjusted by the concentration of the suspension liquid or the pull-up speed of pulling up the mold 41 from the suspension liquid. The concentration of the suspension liquid, and the pull-up speed of pulling up the mold 41 from the suspension liquid are determined so that the thickness becomes about 10 µm.

Here, electrodes 2a and 2b are formed on an inner circumferential surface and an outer circumferential surface of the manufactured coil-shaped piezoelectric ceramic 1, and a polarization treatment is performed as the need arises, so that the coil-shaped actuator can be manufactured.

Besides, when the coil-shaped piezoelectric ceramic 1 which is removed from the mold 41 and in which the electrodes 2 are formed, is again dipped in the alcohol solution in which the fine particles of piezoelectric ceramic are suspended, and is pulled up from the alcohol solution, the piezoelectric ceramic of laminate structure can be manufactured.

Further, the coil-shaped piezoelectric ceramic 1 may be removed from the mold 41 without performing the HIP processing. In this case, since the fine particles of the piezoelectric ceramic 1 are not bonded between the particles, sufficient polarization is achieved when the polarization treatment is performed, and the piezoelectric efficiency can be improved.

In this case, the electrode 2 is previously formed on the hydrophilic region of the mold 41, and is dipped in the suspension liquid. Then, a metal film or the like is stuck as the electrode 2 on the surface of the mold 41 pulled up from the suspension liquid, and the polarization treatment is performed. By this, the polarization treatment is performed to the piezoelectric ceramic 1.

Also in the piezoelectric ceramic 1 manufactured in this method, similar effects to the case of manufacture using the hydrothermal synthesis can be obtained.

Figure 4:
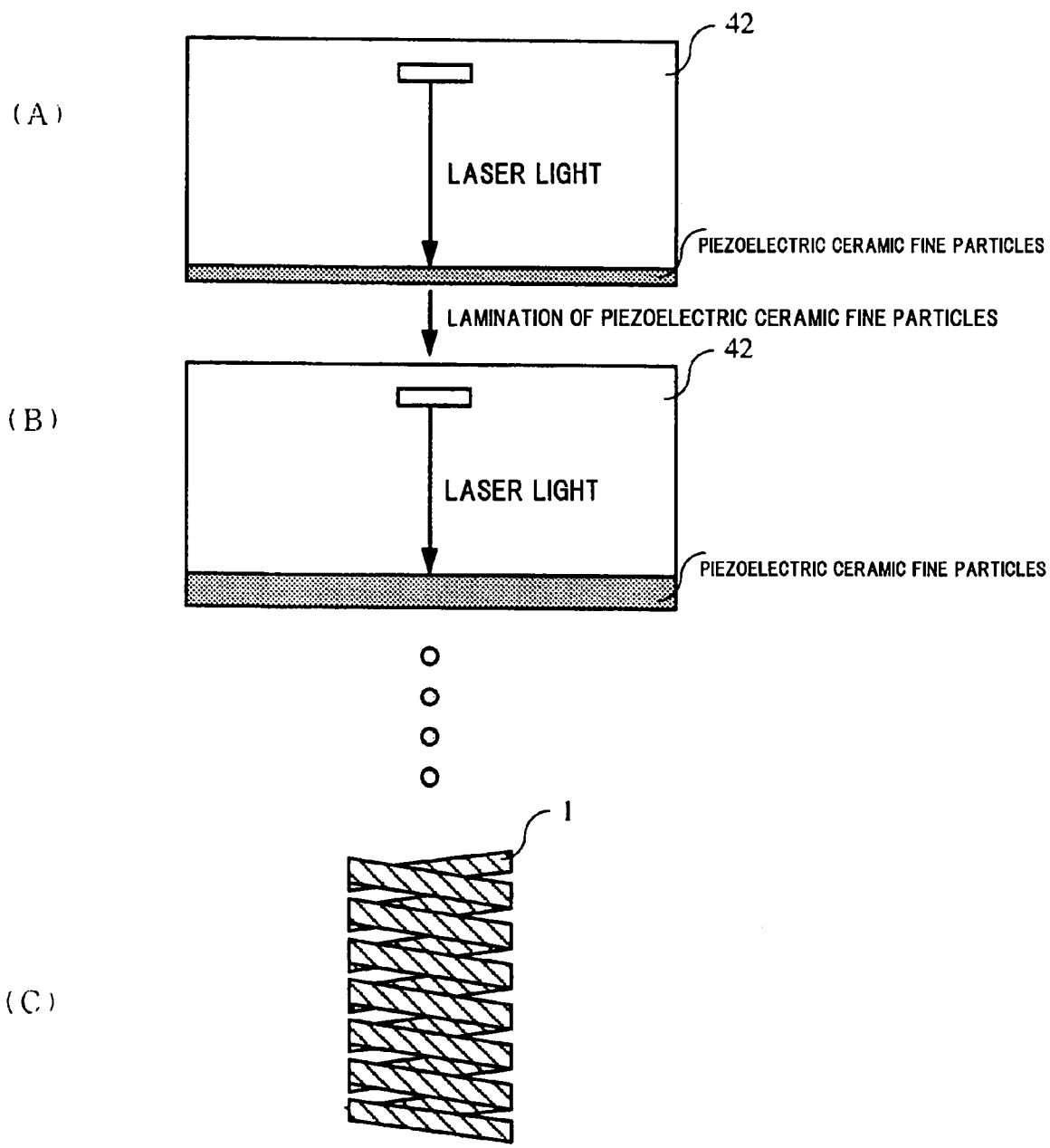
FIGS. 4A to 4C are views for explaining a manufacturing process of a coil-shaped piezoelectric ceramic applied to the actuator of the embodiment of the present invention.

Further, a method of manufacturing a coil-shaped piezoelectric ceramic 1 without using the molds 40 and 41 will be described. This method is a method which is recently popularized and in which while metal powder is laminated in a vessel, the metal powder is melted and sintered into a desired shape by energy of a laser beam. In this method, as shown in FIGS. 4A and 4B, while fine particles of piezoelectric ceramic such as PZT are laminated in a pressurized chamber 42 filled with an inert gas, laser light is irradiated to the laminated fine particles of piezoelectric ceramic in the pressurized chamber 42. In the portion which is irradiated with the laser light, the fine particles of the piezoelectric ceramic are melted and sintered. The laser light is irradiated so that the coil-shaped piezoelectric ceramic 1 is formed by this melting and sintering. Also by this method, the coil-shaped piezoelectric ceramic 1 shown in FIG. 4C can be easily manufactured. Besides, the piezoelectric ceramic 1 of another shape, such as a spring-shaped piezoelectric ceramic 1 described later, can also be manufactured.

Besides, since the piezoelectric ceramic laminated in the pressurized chamber 42 is made the fine particles, sintering can be performed at substantially the same temperature as the other metal. Besides, by applying sufficient vapor pressure to the pressurized chamber 42, vaporization of lead in PZT at the time of melting and sintering can be suppressed, and the safety of operation can also be assured.

Electrodes 2a and 2b are formed on an inner circumferential surface and an outer circumferential surface of the coil-shaped piezoelectric ceramic 1 manufactured by the above method, and the polarization treatment is performed as the need arises, so that the coil-shaped actuator can be manufactured.

As stated above, in the actuator of this embodiment, the manufacturing process is simple and does not include a troublesome step, so that the manufacturing cost is low. Besides, since the displacement amount can be adjusted by the number of turns of the coil or the like, a displacement enlargement mechanism portion may not be used as in the prior art (the number of turns has only to be adjusted), so that the actuator is small.

Next, the operation of the actuator of this embodiment will be described. When voltage is applied between the electrodes 2a and 2b (positive voltage is applied to the electrode 2a, and negative voltage is applied to the electrode 2b) formed on the inner circumferential surface and the outer circumferential surface of the piezoelectric ceramic 1 wound like the coil, the piezoelectric ceramic 1 wound like the coil is deformed in such a direction that its inner circumferential side is contracted and its outer circumferential side is expanded by the piezoelectric inverse effect. Accordingly, the actuator of this embodiment is displaced (deformed) in the direction to contract the diameter of the coil.

Here, if one end portion of the actuator is fixed (for example, the right end portion shown in FIG. 1A), the other end portion is rotated in accordance with this displacement (the right end portion shown in FIG. 1A is rotated in the illustrated direction). At this time, the rotation direction of the other end portion is determined by the winding direction of the piezoelectric ceramic 1, and the number of revolutions of the other end portion is determined by the number of turns of the piezoelectric ceramic 1, the applied voltage between the electrodes 2a and 2b, and the like.

Besides, the actuator of this embodiment continues to keep the state after the change (the state where the coil diameter is contracted) when the voltage continues to be applied between the electrodes 2a and 2b. However, if the voltage application is stopped, the actuator is returned to the state before the voltage is applied (the state before the coil diameter is contracted), that is, the initial state. Accordingly, by stopping the voltage application between the electrodes 2a and 2b, the other end portion of the actuator can be rotated in the reverse direction to that at the time of the voltage application.

As stated above, the actuator of this embodiment does not require a driver circuit of a complicated structure as in a conventional ultrasonic motor, and its rotation operation can be controlled by a simple switching circuit capable of carrying out application control of voltage between the electrodes 2a and 2b.

Besides, the actuator of this embodiment has a simple structure in which the electrodes 2a and 2b are formed on the inner circumferential surface and the outer circumferential surface of the piezoelectric ceramic 1 shaped like the coil, the piezoelectric ceramic 1 can be easily shaped like the coil by the extrusion molding or the methods shown in FIGS. 2A to 4C, and the electrodes 2a and 2b on the inner circumferential surface and the outer circumferential surface of the piezoelectric ceramic 1 shaped like the coil can also be easily formed by the well-known method such as the printing or plating method. Accordingly, the actuator of this embodiment can be formed inexpensively since the manufacturing process is simple and it does not take labor.

Besides, if the switching circuit is constructed so that a reverse voltage (negative voltage is applied to the electrode $2a$, and positive voltage is applied to the electrode $2b$) can be applied between the electrodes $2a$ and $2b$, the number of revolutions of the other end portion which is not fixed, can be substantially doubled. Besides, the return to the initial state can also be made at high speed. Further, if an attenuation circuit of LCR is provided between the electrodes $2a$ and $2b$, speed control at the time of rotation can be performed.

Next, another embodiment of an actuator of the present invention will be described. FIGS. 5A to 5c are views showing an outer appearance of the actuator of the embodiment, FIG. 5A is a front view, FIG. 5B is a view seen in a direction "A" shown in FIG. 5A, and FIG. 5C is a sectional view taken in a direction B—B shown in FIG. 5A. The actuator of this embodiment is such that piezoelectric ceramics $1a$ and $1b$ as strain elements are respectively formed on an outer circumferential surface and an inner circumferential surface of a metal coil 3, and electrodes $2a$ and $2b$ are formed on surfaces of the piezoelectric ceramics $1a$ and $1b$ (the surface here is a surface opposite to a contact surface to the metal coil 3). The piezoelectric ceramics $1a$ and $1b$ and the electrodes $2a$ and $2b$ are formed over substantially the full length of the metal coil 3.

The polarization treatment is performed so that the piezoelectric ceramic $1a$ formed on the inner circumferential surface of the metal coil 3 is deformed in the contracting direction when voltage is applied between the electrode $2a$ formed on the surface and the metal coil 3 (positive voltage is applied to the electrode $2a$, and the negative voltage is applied to the metal coil 3) (see FIG. 5C). Besides, the polarization treatment is performed so that the piezoelectric ceramic $1b$ formed on the outer circumferential surface of the metal coil 3 is deformed in the expanding direction when voltage is applied between the electrode $2b$ formed on the surface and the metal coil 3 (positive voltage is applied to the electrode $2b$, and negative voltage is applied to the metal coil 3) (see FIG. 5C).

Next, a manufacturing process of the actuator of this embodiment will be described. First, the piezoelectric ceramics $1a$ and $1b$ are formed on the inner circumferential surface and the outer circumferential surface of the metal coil 3. If hydrothermal synthesis disclosed in, for example, Japanese Patent Unexamined Publication No. Hei. 5-136476, is used, the piezoelectric ceramics $1a$ and $1b$ can be easily formed over substantially the full length of the metal coil 3. In the case where this hydrothermal synthesis is used, the piezoelectric elements $1a$ and $1b$ formed over substantially the full length of the metal coil 3 are polarized as well. However, in the hydrothermal synthesis, the polarization directions of the piezoelectric elements $1a$ and $1b$ are respectively directed toward the metal coil 3. Thus, when voltage is applied as shown in FIG. 5C, since both of the piezoelectric element $1a$ at the inner circumferential surface side and the piezoelectric element $1b$ at the outer circumferential surface side are deformed in the direction to expand the metal coil 3, the metal coil 3 is hardly deformed. Incidentally, if voltage is applied between the electrodes $2a$ and $2b$ differently from the application of the voltage shown in FIG. 5C (for example, positive voltage is applied to the electrode $2a$, and negative voltage is applied to the electrode $2b$), deformation can be generated in the metal coil 3. However, in this case, in order to obtain a sufficient displacement amount in the metal coil 3, a relatively high voltage (voltage value) must be applied between the electrodes $2a$ and $2b$.

However, if <1> after the piezoelectric ceramics $1a$ and $1b$ are formed by the hydrothermal synthesis over substantially the full length of the metal coil 3, heating and cooling to the Curie temperature is performed to remove the polarization of the piezoelectric ceramics $1a$ and $1b$, <2> the electrodes $2a$ and $2b$ are formed on the piezoelectric ceramics $1a$ and $1b$, and <3> the polarization treatment (re-polarization treatment) for adjusting the polarization directions of the piezoelectric ceramics $1a$ and $1b$ in the same direction is performed, a sufficient deformation amount can be obtained in the metal coil 3 by application of a relatively low voltage (voltage value) by the method shown in FIG. 5C.

Besides, the piezoelectric ceramics $1a$ and $1b$ are formed over substantially the full length of the metal coil 3 by using, not the hydrothermal synthesis, but another method, 1 and the piezoelectric ceramic 1 is sintered by performing the firing step, and then, the electrodes $2a$ and $2b$ may be formed on the surfaces of the piezoelectric ceramics $1a$ and $1b$, and the polarization treatment and aging may be performed.

The actuator of this embodiment can be manufactured by the above process.

As stated above, the actuator of this embodiment is also inexpensive since a troublesome step is not included in its manufacturing process and its manufacture is simple.

Next, the operation of the actuator of this embodiment will be described. When voltage is applied between the electrodes $2a$, $2b$ and the metal coil 3 (positive voltage is applied to the electrodes $2a$, $2b$, and negative voltage is applied to the metal coil 3), the piezoelectric ceramic $1a$ formed on the inner circumferential surface of the metal coil 3 is contracted by the piezoelectric inverse effect, and the piezoelectric ceramic $1b$ formed on the outer circumferential surface of the metal coil 3 is expanded. The metal coil 3 is deformed in the direction to contract the diameter of the coil by the deformation of the piezoelectric ceramic 1.

Accordingly, as described in the above embodiment, if one end portion of the metal coil 3 is fixed (if one end of this actuator is fixed (for example, the right end portion shown in FIG. 5A)), the other end portion is rotated in accordance with the deformation of contracting this diameter (for example, the right end portion shown in FIG. 5A is rotated in the illustrated direction). At this time, the rotation direction of the other end portion is determined by the winding directions of the piezoelectric ceramics $1a$ and $1b$, and the number of revolutions of the other end portion is determined by the number of turns of the piezoelectric ceramics $1a$ and $1b$ and the applied voltage between the electrodes $2a$ and $2b$.

Besides, when the application of the voltage is stopped, the actuator of this embodiment is also returned to the initial state before the voltage is applied. Accordingly, by stopping the application of the voltage between the electrodes $2a$ and $2b$, the other end portion of the actuator can be rotated in the direction reverse to that at the application of the voltage.

As stated above, the actuator of this embodiment does not also require a driver circuit of a complicated structure as in a conventional ultrasonic motor, and the rotation operation can be controlled by a simple switching circuit capable of carrying out application control of voltage between the electrodes $2a$ and $2b$.

Besides, the actuator of this embodiment has the simple structure in which the piezoelectric ceramics $1a$ and $1b$ are formed on the inner circumferential surface and the outer circumferential surface of the metal coil 3, and the electrodes 2a and 2b are formed on the surfaces of the piezoelectric ceramics 1a and 1b. Besides, the piezoelectric ceramics 1a and 1b can be easily formed on the inner circumferential surface and the outer circumferential surface of the metal coil 3 by the well-known hydrothermal synthesis, and the formation of the electrodes 2a and 2b on the surfaces of the piezoelectric ceramics 1a and 1b can also be easily performed by the well-known processing technique such as the printing or plating method. Accordingly, a troublesome step is not included in the manufacturing process and the actuator of this embodiment can also be formed inexpensively.

Besides, similarly to the actuator of the above embodiment, if the switching circuit is constructed such that a reverse voltage (negative voltage is applied to the electrode 2a, and positive voltage is applied to the electrode 2b) can be applied between the electrodes 2a, 2b and the metal coil 3, the number of revolutions of the other end portion can be doubled. Besides, the return to the initial state can also be made at high speed. Further, if an attenuation circuit of LCR is provided between the electrodes 2a and 2b, the speed control of the rotation operation, and the like can also be carried out.

Incidentally, although FIGS. 5A to 5C show the actuator in which the piezoelectric ceramics 1a and 1b are respectively formed on the inner circumferential surface and the outer circumferential surface of the metal coil 3, the actuator may be such that the piezoelectric ceramic 1 is formed only on one of the inner circumferential surface and the outer circumferential surface.

Hereinafter, use examples of the actuator shown in FIGS. 5A to 5C will be described. Incidentally, it is needless to say that similar effects can be obtained even when the actuator is replaced by the actuator shown in FIGS. 1A to 1C.

Figure 6:
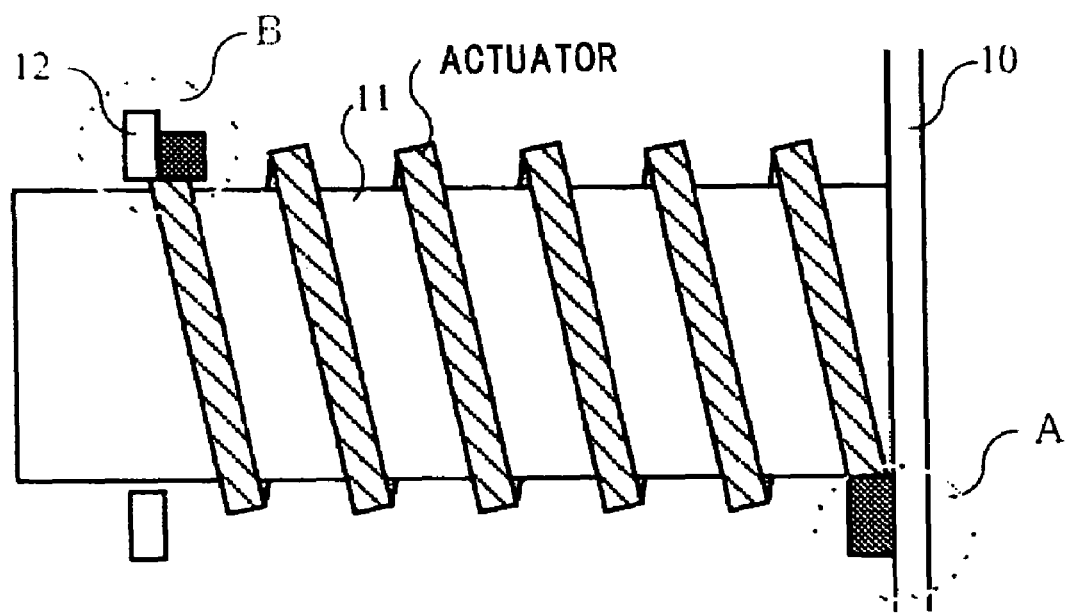
FIG. 6 is a view showing an applied example of an actuator of an embodiment of the present invention.

In a use example shown in FIG. 6, an actuator is fitted on a shaft 11 fixed to a base 10. One end portion of the actuator is fixed to the base 10 at portion A shown in the drawing, and the other end portion is fixed to a disk 12, which is rotatably attached to the shaft 11, at portion B shown in the drawing.

In this use example, when voltage is applied between the electrodes 2a, 2b and the metal coil 3 of the actuator, and the not-fixed end portion of the actuator is rotated, the disk 12 is rotated in accordance with the rotation. By the rotation operation of the disk 12, for example, a distributing flapper of bills of an automatic teller machine (ATM) can be driven, or a valve of liquid can be closed or opened.

Besides, if the shaft 11 is rotatably attached to the base 10, the actuator can also be used for a mechanism portion for rotating the shaft 11.

Figure 7:
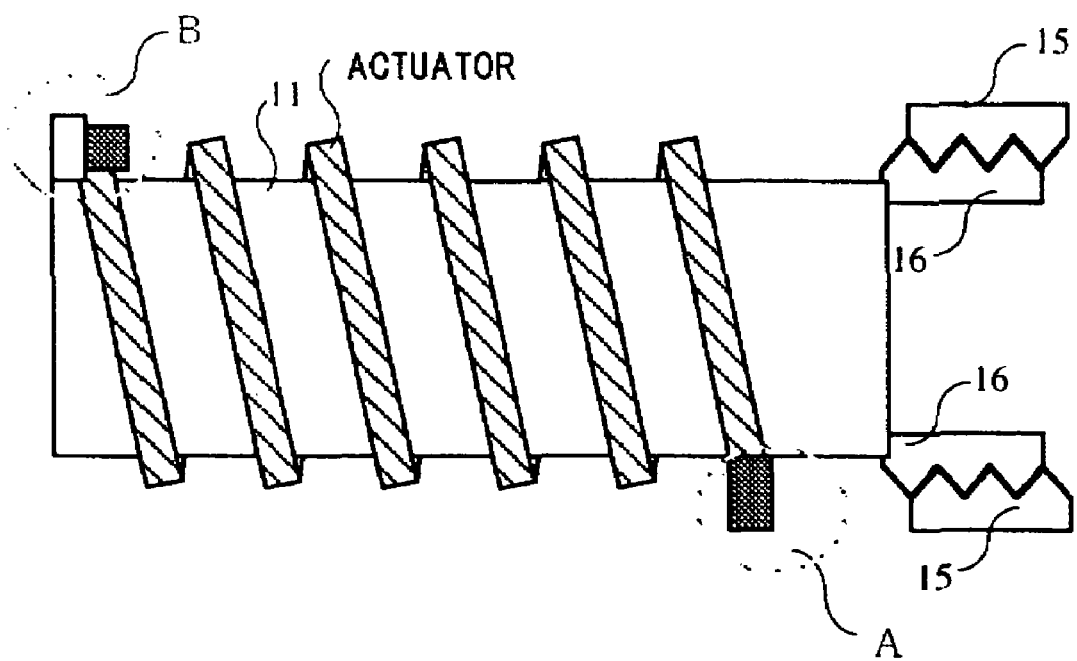
FIG. 7 is a view showing an applied example of an actuator of an embodiment of the present invention.

Besides, in a use example shown in FIG. 7, when voltage is applied between the electrodes 2a, 2b and the metal coil 3 of the actuator, a shaft 11 is rotated in accordance with the rotation of the actuator. The shaft 11 is fitted by screws 15 and 16 as shown in the drawing, and the shaft 11 is constructed to slide in the axial direction by the rotation. The screw 15 is attached to an apparatus body, and the screw 16 is attached to the shaft 11.

Figure 8:
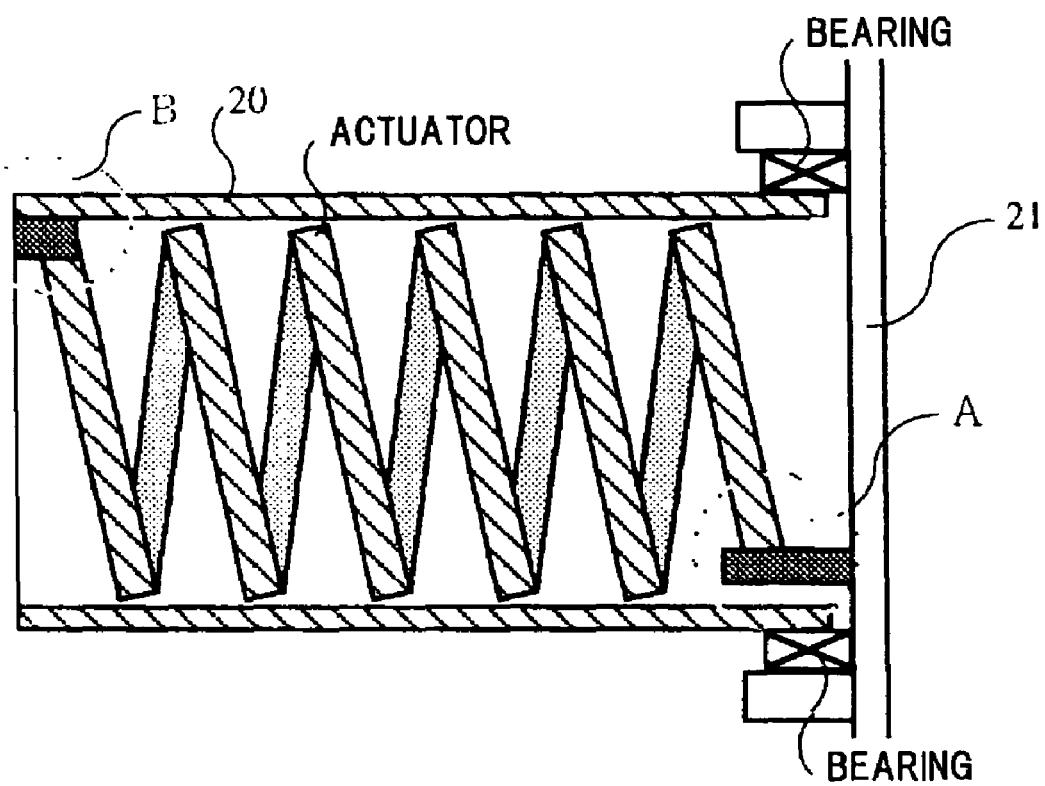
FIG. 8 is a view showing an applied example of an actuator of an embodiment of the present invention.
Figure 9:
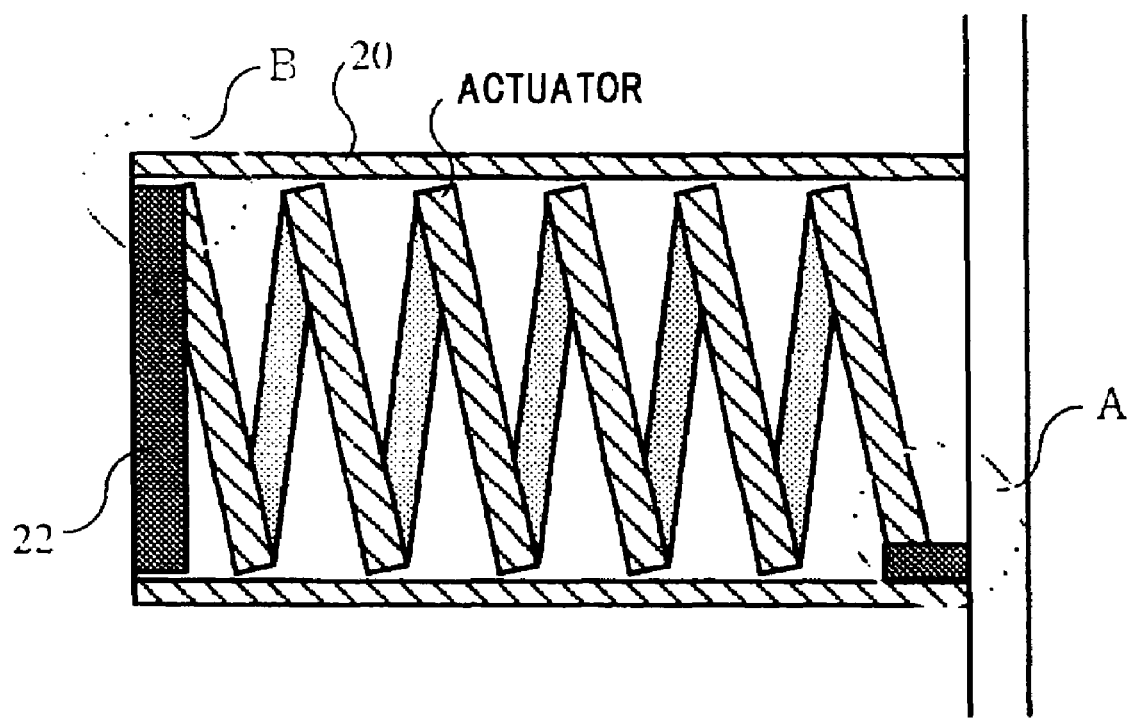
FIG. 9 is a view showing an applied example of an actuator of an embodiment of the present invention.

Besides, as shown in FIG. 8 and FIG. 9, the actuator may be attached to the inside of a cylindrical shaft 20. As stated above, if the actuator is mounted in the cylindrical shaft 20, since the influence of external force can be suppressed, this is effective for a swing device of a machine tool or the like. Incidentally, in FIG. 8, one end portion of the actuator is fixed to a base 21 at portion A shown in the drawing, and the other end portion is fixed to an inner circumferential surface of the shaft 20 at portion B. Accordingly, when voltage is applied between the electrodes 2a, 2b and the metal coil 3 of the actuator, the shaft 20 can be rotated. Besides, in FIG. 9, one end portion of the actuator is fixed to an inner circumferential surface of a shaft 20 at portion A shown in the drawing, and the other end portion is fixed to a disk 22 inserted in the shaft 20 at portion B shown in the drawing. The disk 22 is rotatably attached to the shaft 20. Accordingly, when voltage is applied between the electrodes 2a, 2b and the metal coil 3 of the actuator, the disk 22 inserted in the shaft 20 is rotated.

Figure 10:
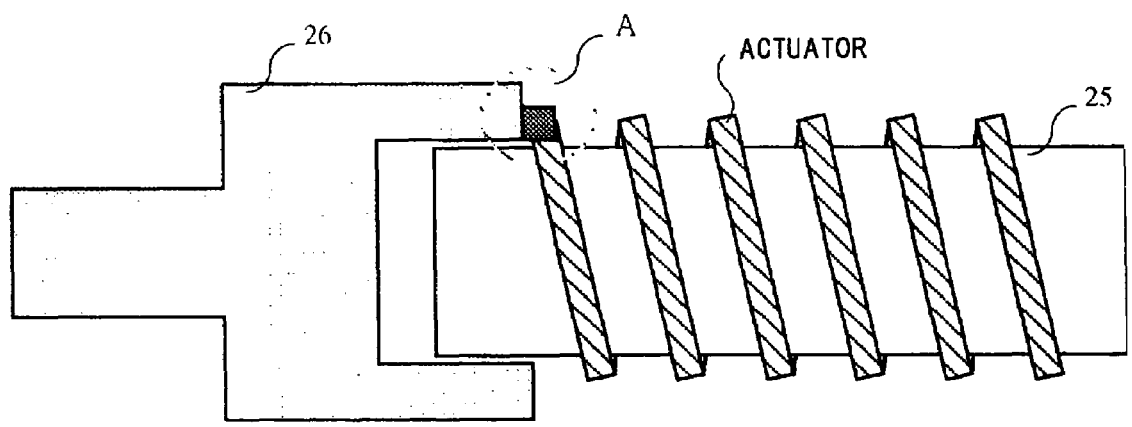
FIG. 10 is a view showing an applied example of an actuator of an embodiment of the present invention.

Further, the actuator of this embodiment can also be used for a clutch as shown in FIG. 10. In FIG. 10, reference numeral 25 designates a shaft to be driven and the shaft 25 to be driven is inserted in the actuator. One end portion of the actuator is fixed to a driving shaft 26 at portion A shown in the drawing.

When voltage is not applied between the electrodes 2a, 2b and the metal coil 3 of the actuator, since the inner diameter of the metal coil 3 is larger than the outer diameter of the shaft 25 to be driven, the rotation of the driving shaft 26 is not transmitted to the shaft 25 to be driven. On the other hand, if voltage is applied between the electrodes 2a, 2b and the metal coil 3 of the actuator, the inner diameter of the metal coil 3 is contracted to produce the state in which the inner circumferential surface is in press contact with the outer circumferential surface of the shaft 25 to be driven, and the rotation of the driving shaft 26 is transmitted to the shaft 25 to be driven. As stated above, the actuator of the embodiment can also be used as the clutch.

Besides, if the actuator is such that when voltage is not applied between the electrodes 2a, 2b and the metal coil 3, the inner diameter of the metal coil 3 is smaller than the outer diameter of the shaft 25 to be driven, and the inner circumferential surface of the metal coil 3 is in press contact with the outer circumferential surface of the shaft 25 to be driven, and when voltage is applied between the electrodes 2a, 2b and the metal coil 3 of the actuator, the inner diameter of the metal coil 3 becomes larger than the outer diameter of the shaft 25 to be driven, the actuator can also be used as a clutch for cutting off the rotation of the driving shaft 26 transmitted to the shaft 25 to be driven when voltage is applied (it can be used as a cutoff clutch).

Besides, if the shaft 25 to be driven is fixed, the actuator of this embodiment can also be used as a brake.

Figure 11:
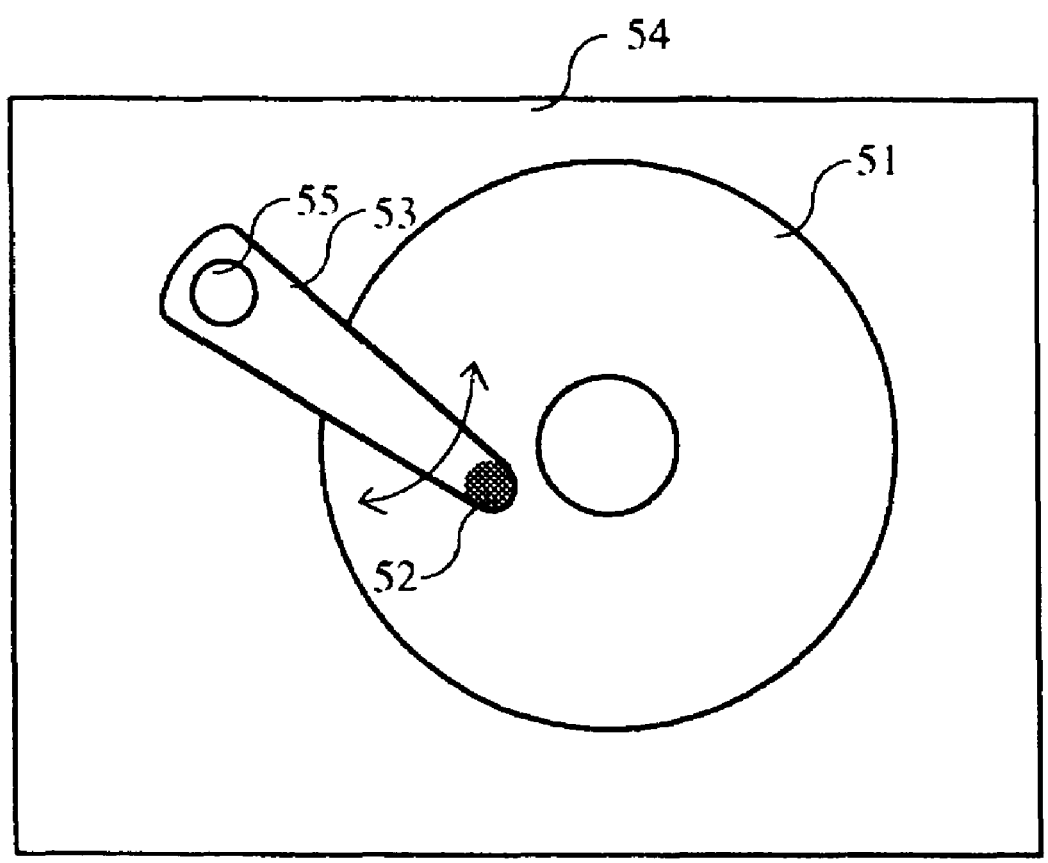
FIG. 11 is a view showing an applied example of an actuator of an embodiment of the present invention.

Further, the actuator can also be used for a driving mechanism portion of a magnetic head in an apparatus for writing magnetic data in a magnetic recording medium such as a hard disk or a floppy disk. FIG. 11 is a schematic top view showing a hard disk device to which the actuator is applied. In FIG. 11, reference numeral 51 designates a disk 51 in which magnetic data is recorded. This disk 51 is rotated by a not-shown motor. Reference numeral 52 designates a magnetic head for writing/reading the magnetic data in/from the disk 51. The magnetic head 52 is attached to one end portion of a lever 53. The other end portion of the lever 53 is freely attached to a rotating shaft 55 fixed to a base 54 of a main body. By the rotation (direction shown by an arrow in the drawing) of the lever 53, a position opposite to the magnetic head 52 is moved in the radius direction of the disk 51.

Since the writing operation and reading operation of the magnetic data in the hard disk device are well-known, the description is omitted here.

Figure 12:
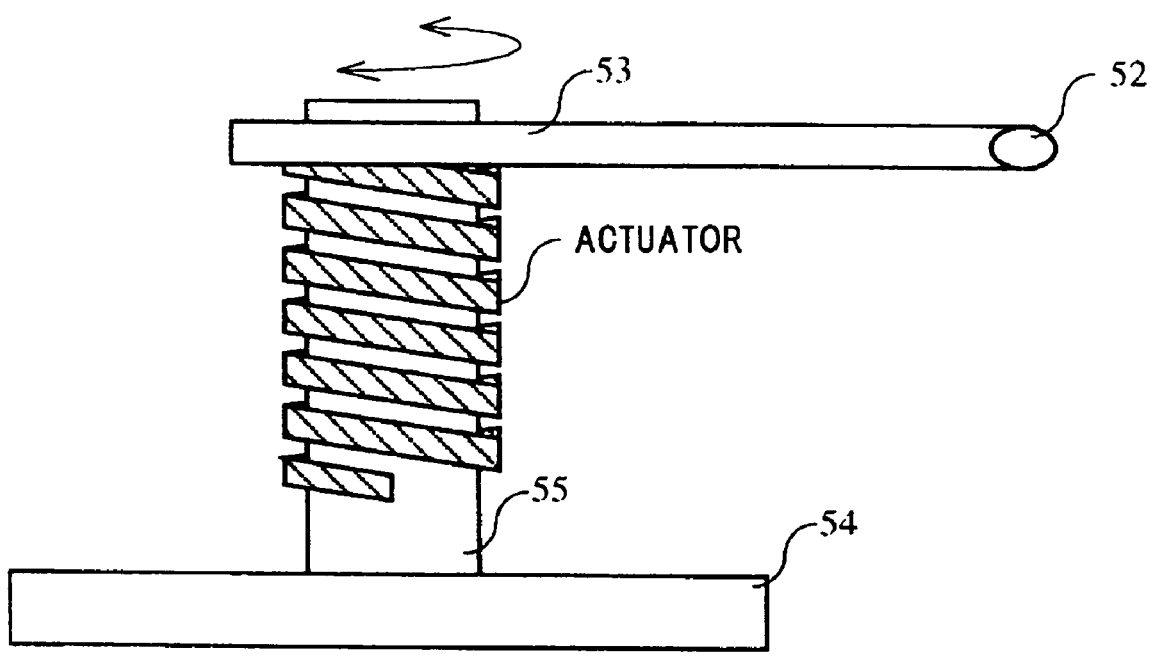
FIG. 12 is a view showing an applied example of an actuator of an embodiment of the present invention.

FIG. 12 is a view showing a structure of a head driving portion for moving a magnetic head in a radius direction of a disk. The coil-shaped actuator of the embodiment is applied to the head driving portion. As shown in the drawing, a rotating shaft 55 fixed to a base 54 is inserted in the actuator. The inner diameter of the actuator is larger than the outer diameter of the rotating shaft 55. One end portion (lower end portion in the drawing) of the actuator is fixed to the rotating shaft 55, and the other end portion is fixed to a lever 53.

As described above, when voltage is applied between the electrodes 2a, 2b and the metal coil 3 of the actuator, the actuator is deformed in the direction to decrease the inner diameter. The lever 53 is rotated by the deformation of the actuator, and a magnetic head 52 is moved in the radius direction of the disk 51. Accordingly, by adjusting the voltage applied between the electrodes 2a, 2b and the metal coil 3 of the actuator to control the displacement amount of the actuator, the magnetic head 52 can be moved to a suitable position with respect to the disk 51.

As stated above, by using the actuator of this embodiment, the structure of the driving mechanism portion for driving the magnetic head 52 becomes simple, so that miniaturization of an apparatus body and reduction in weight can be realized. Besides, since the piezoelectric ceramic has a very small time constant, an access time to the disk 51 can be shortened. Besides, since the consumed electric power of the piezoelectric ceramic is small, the consumed electric power of the apparatus body can be reduced. Further, since the positioning control of the magnetic head 52 can be carried out by the voltage control, the circuit structure for operating the driving mechanism portion is simple, and the cost of the main body can be reduced.

Incidentally, although the above description has been given of the example in which the actuator is used as the driving portion of the magnetic head, the actuator of this embodiment can also be applied to a driving mechanism portion for driving an optical pickup head or the like.

Next, an actuator of another embodiment of the present invention will be described. FIGS. 13A to 13D are views showing the actuator of this embodiment. FIG. 13A is a front view, FIG. 13B is a view seen in a direction "A" shown in FIG. 13A, FIG. 13C is a view seen in a direction "B" shown in FIG. 13A, and FIG. 13D is a sectional enlarged view taken in a direction C—C shown in FIG. 13B. The actuator of this embodiment is such that electrodes 2 (2a, 2b) are formed on an upper surface and a lower surface of a piezoelectric ceramic 1 wound like a coil as shown in the drawing. The electrode 2a formed on the upper surface of the piezoelectric ceramic 1 is thinner than the width of the piezoelectric ceramic 1 and is formed along the outer circumference of the piezoelectric ceramic 1. On the other hand, the electrode 2b formed on the lower surface of the piezoelectric ceramic 1 is thinner than the width of the piezoelectric ceramic 1 and is formed along the inner circumference of the piezoelectric ceramic 1. The width of each of the electrodes 2a and 2b is approximately half of the width of the piezoelectric ceramic 1 wound like the coil. It is desirable that the width of each of the electrodes 2a and 2b is not larger than half of the width of the piezoelectric ceramic 1. The electrodes 2a and 2b are formed over substantially the full length of the piezoelectric ceramic 1. The piezoelectric ceramic 1 is subjected to the polarization treatment so that when voltage is applied between the electrodes 2a and 2b formed on the upper surface and the lower surface (positive voltage is applied to the electrode 2a, and negative voltage is applied to the electrode 2b), it is expanded in a diagonal direction in which the electrodes 2a and 2b are formed as shown in FIG. 13D, and is contracted in a diagonal direction in which the electrodes 2a and 2b are not formed.

Next, a manufacturing process of the actuator of this embodiment will be described. The manufacturing process of the actuator of this embodiment is substantially the same as that shown in FIG. 1. First, the piezoelectric ceramic 1 is shaped like the coil, the piezoelectric ceramic 1 shaped like the coil is sintered (the so-called firing step is performed), and the electrodes 2a and 2b are formed on the upper surface and the lower surface of the sintered coil-shaped piezoelectric ceramic 1. At this time, the electrodes 2a and 2b are formed over the whole width of the piezoelectric ceramic 1. Thereafter, after the polarization treatment and aging are carried out, an unnecessary portion of the electrode 2a at the inner circumferential side of the piezoelectric ceramic 1 is removed, and an unnecessary portion of the electrode 2b at the outer circumferential side of the piezoelectric ceramic 1 is removed. By the above process, the actuator of this embodiment can be manufactured. Besides, an unnecessary portion is masked and an electrode may be formed by an electroless plating method.

Further, the coil-shaped piezoelectric ceramic 1 is formed by the methods shown in FIGS. 2A to 4C, and then, the formation of the electrodes 2a and 2b, and the polarization treatment may be carried out.

As stated above, the actuator of this embodiment can also be easily manufactured, and a troublesome step is not included, so that the actuator can be formed inexpensively.

The operation of the actuator of this embodiment will be described. When voltage is applied between the electrodes 2a and 2b formed on the upper surface and the lower surface of the piezoelectric ceramic 1 wound like the coil (positive voltage is applied to the electrode 2a, and negative voltage is applied to the electrode 2b), the piezoelectric ceramic 1 is distorted in the width direction (direction shown by an arrow in the drawing), and the piezoelectric ceramic 1 wound like the coil is expanded in the axial direction of the coil. As stated above, the actuator of this embodiment is displaced in the axial direction by applying the voltage between the electrodes 2a and 2b. Besides, also in the actuator of this embodiment, similarly to the above embodiment, the displacement in the axial direction can be controlled by a simple switching circuit capable of carrying out application control of voltage between the electrodes 2a and 2b.

Figure 14:
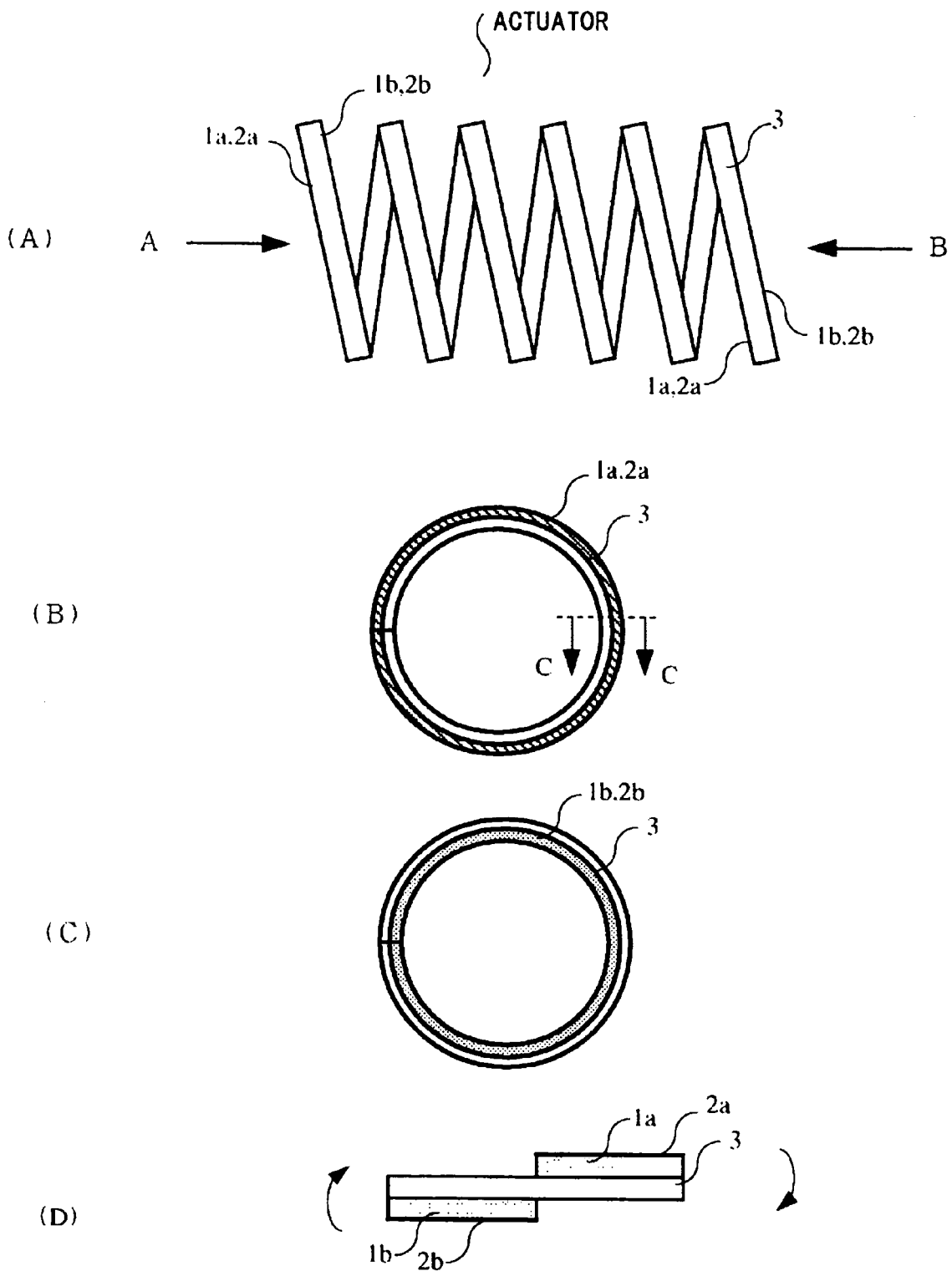
FIGS. 14A to 14D are views showing an actuator of another embodiment of the present invention.

Next, another embodiment of an actuator which is displaced in an axial direction similarly to the actuator of the above embodiment will be described. FIGS. 14A to 14D are views showing the actuator of this embodiment. FIG. 14A is a front view, FIG. 14B is a view seen in a direction "A" shown in FIG. 14A, FIG. 14C is a view seen from a direction "B" shown in FIG. 14A, and FIG. 14D is a sectional view taken in a direction C—C shown in FIG. 14B. The actuator of this embodiment is such that piezoelectric ceramics 1a and 1b are respectively formed on an upper surface and a lower surface of a metal coil 3 wound like a coil, and electrodes 2 (2a, 2b) are formed on surfaces of the piezoelectric ceramics 1a and 1b. The piezoelectric ceramic 1a formed on the upper surface of the metal coil 3 is formed in a winding direction along a side portion at an outer circumferential side, and the piezoelectric ceramic 1 formed on the lower surface of the metal coil 3 is formed in the winding direction along a side portion at an inner circumferential side. The width of each of the piezoelectric ceramics 1a and 1b is approximately half of the width of the metal coil 3 wound like the coil. Preferably, the width of each of the piezoelectric ceramics 1a and 1b is not larger than half of the width of the metal coil 3 wound like the coil. Besides, the piezoelectric ceramics 1a and 1b are formed over substantially the full length of the metal coil 3. Further, a polarization adjustment is made such that when voltage is applied between the electrodes 2a, 2b and the metal coil 3 (positive voltage is applied to the electrodes 2a and 2b, and negative voltage is applied to the metal coil 3), the piezoelectric ceramics 1a and 1b of this embodiment are expanded in the vertical direction with respect to the sheet face in FIG. 14D.

Next, a manufacturing process of the actuator of this embodiment will be described. The manufacturing process of the actuator of the embodiment is substantially the same as that shown in FIGS. 5A to 5C. First, the piezoelectric ceramics 1a and 1b are formed on the upper surface and the lower surface of the metal coil 3 by hydrothermal synthesis. At this time, the piezoelectric ceramic 1a is formed only on a necessary portion of the upper surface of the metal coil 3 at the outer circumferential side, and the piezoelectric ceramic 1b is formed only on a necessary portion of the lower surface of the metal coil 3 at the inner circumferential side.

Here, in the case where the piezoelectric ceramics 1a and 1b are formed over substantially the full length of the metal coil 3 by the hydrothermal synthesis, the polarization directions of the piezoelectric ceramics 1a and 1b are directed toward the metal coil 3, and the polarization adjustment is made so that when voltage is applied between the electrodes 2a, 2b and the metal coil 3 (positive voltage is applied to the electrodes 2a, 2b, and negative voltage is applied to the metal coil 3), the piezoelectric ceramics are expanded in the vertical direction with respect to the sheet face. Accordingly, the polarization treatment for removing the polarization of the piezoelectric ceramics 1a and 1b and for again adjusting the polarization direction, which is explained in the manufacturing process of the actuator of FIGS. 5A to 5C, may not be performed.

Besides, the piezoelectric ceramics 1a and 1b are formed over substantially the full length of the metal coil 3 by using, not the hydrothermal synthesis, but another method, and the piezoelectric ceramic 1 is sintered by performing the firing step, and then, the electrodes 2a and 2b may be formed on the surfaces of the piezoelectric ceramics 1a and 1b by the foregoing method, and the polarization treatment, and aging may be performed. The actuator of this embodiment is manufactured by the above process.

As stated above, the actuator of this embodiment can also be easily manufactured, and can be formed inexpensively since a troublesome step is not included.

Next, the operation of the actuator of this embodiment will be described. When voltage is applied between the electrodes 2a, 2b and the metal coil 3 of the actuator (positive voltage is applied to the electrodes 2a, 2b, and negative voltage is applied to the metal coil 3), the metal coil 3 is distorted in the width direction by the displacement of the piezoelectric ceramics 1a and 1b, and the metal coil 3 is expanded in the axial direction. As stated above, the actuator of this embodiment is displaced in the axial direction by applying the voltage between the electrodes 2a, 2b and the metal coil 3. Besides, also in the actuator of this embodiment, similarly to the above embodiment, the displacement in the axial direction can be controlled by a simple switching circuit capable of carrying out application control of voltage between the electrodes 2a, 2b and the metal coil 3.

Further, with respect to the actuator shown in FIGS. 14A to 14D, as shown in FIGS. 15A to 15D, piezoelectric ceramics 1c and 1d may be added on the upper surface and the lower surface of the metal coil 3. The polarization adjustment is made such that the piezoelectric ceramics 1c and 1d are contracted in the vertical direction with respect to the sheet face in FIG. 15D when voltage is applied between the electrodes 2c, 2d formed on the surfaces and the metal coil 3. Accordingly, when voltage is applied between the electrodes 2a to 2d and the metal coil 3 (positive voltage is applied to the electrodes 2a to 2d, and negative voltage is applied to the metal coil 3), the distortion generated in the metal coil 3 is larger than that of the actuator shown in FIG. 14. Accordingly, the actuator of this embodiment generates a larger displacement in the axial direction than that shown in FIG. 14.

Figure 15:
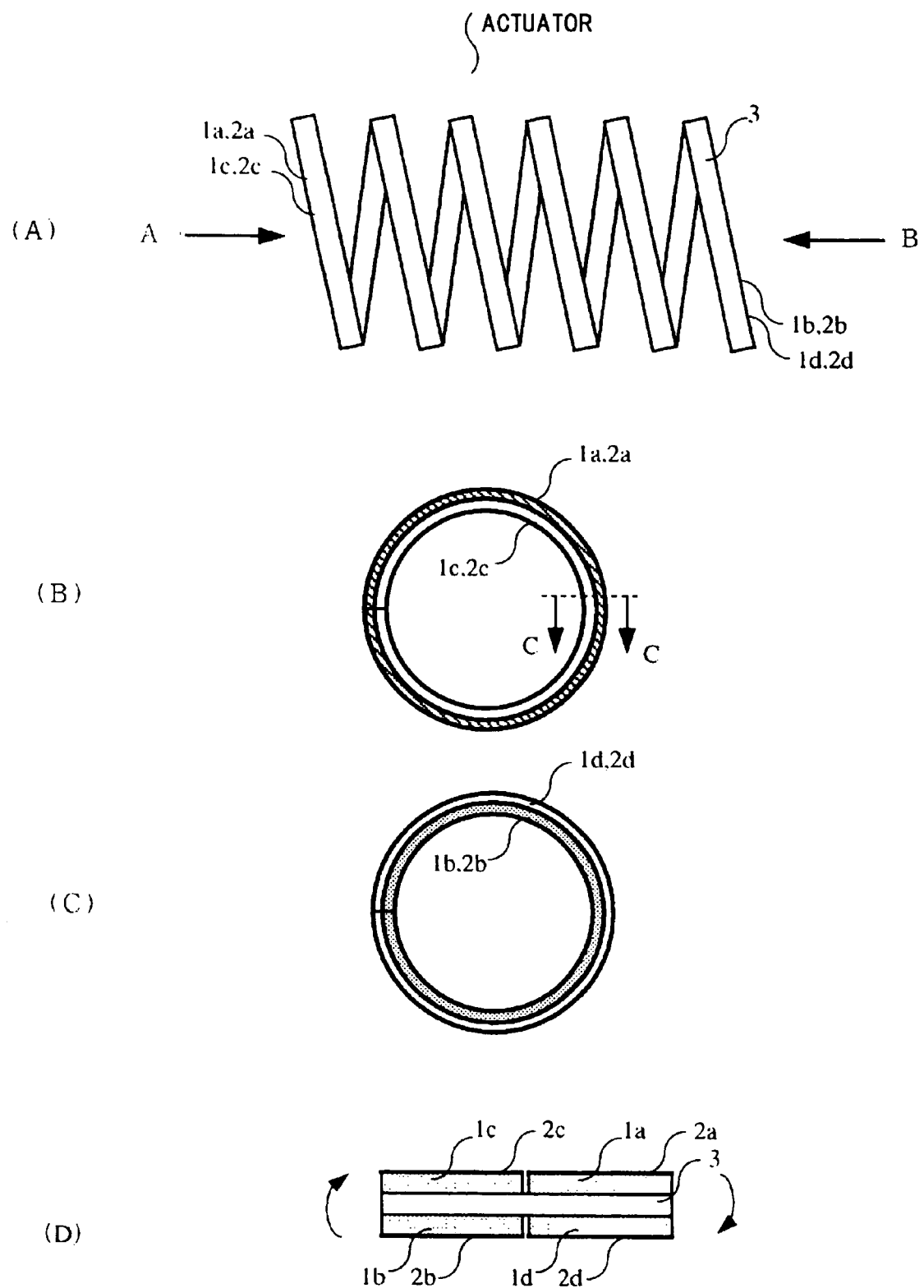
FIGS. 15A to 15D are views showing an actuator of another embodiment of the present invention.

Besides, in the actuator shown in FIG. 15, although two of the piezoelectric ceramics 1a to 1d are formed side by side on the upper surface and the lower surface of the metal coil 3, respectively, two piezoelectric ceramics 1 may be arranged on only one surface of the upper surface and the lower surface.

Incidentally, in the case where the piezoelectric ceramics 1a to 1d are formed on the upper surface and the lower surface of the metal coil 3 by the hydrothermal synthesis, since the polarization directions of the piezoelectric ceramics 1c and 1d are also directed toward the metal coil 3, the polarization treatment for removing the polarization of the piezoelectric ceramics 1a and 1b and for again adjusting the polarization direction, which is explained in the manufacturing process of the actuator of FIG. 2, is carried out.

As stated above, although the actuator shown in FIGS. 13A to 15D are different from the actuator shown in FIGS. 1A to 1C in that the actuator is displaced in the axial direction of the coil, as described above, similarly to the actuator shown in FIGS. 1A to 1C, since the manufacturing process does not include a troublesome step, it can be easily manufactured and is inexpensive.

Figure 16:
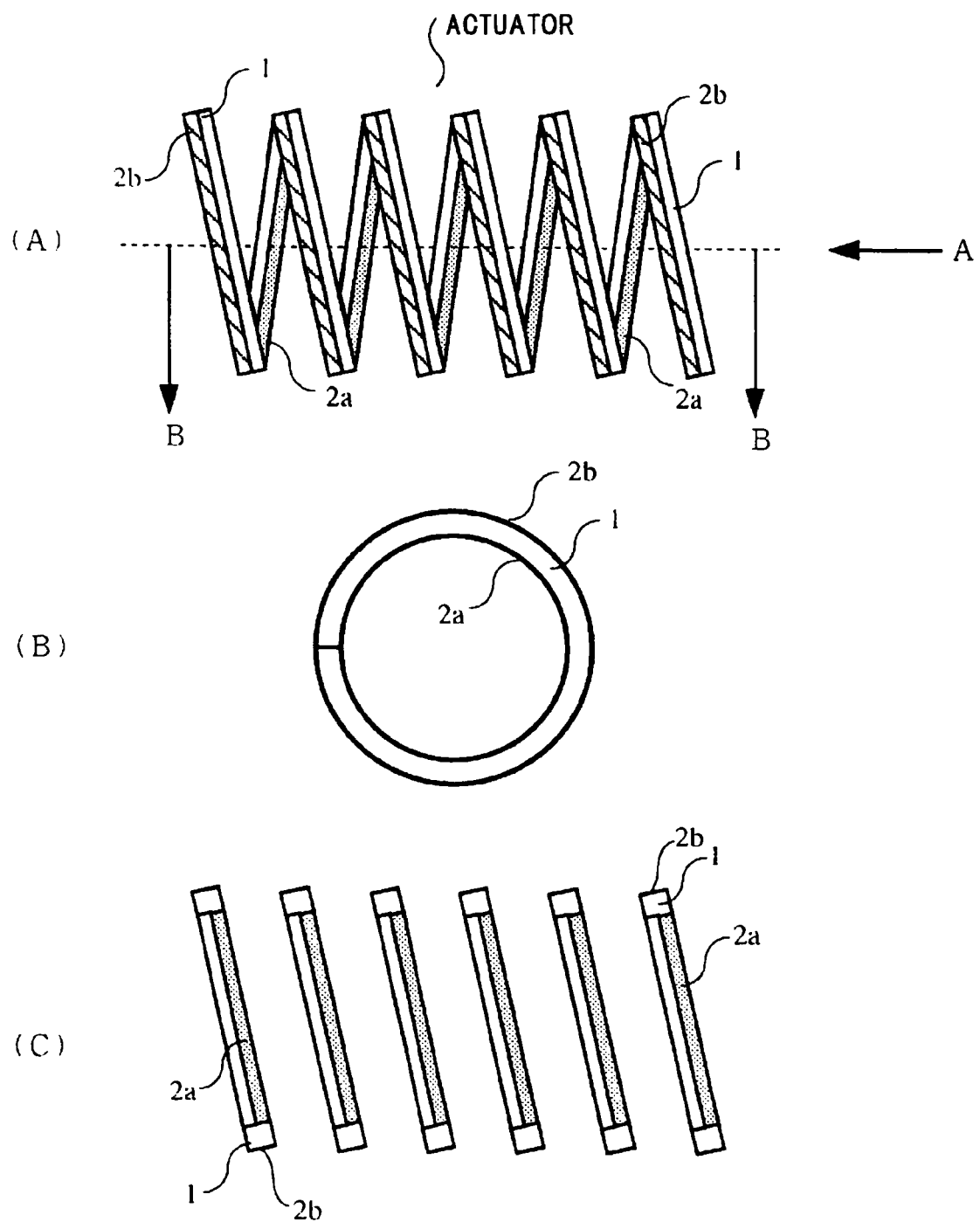
FIGS. 16A to 16C are views showing an actuator of another embodiment of the present invention.

Besides, in the actuator shown in FIGS. 13A to 13D, although the electrodes 2a and 2b narrower than the width of the piezoelectric ceramic 1 are formed on the upper surface and the lower surface of the piezoelectric ceramic 1 shaped like the coil, as shown in FIGS. 16A to 16C, even if electrodes 2a and 2b lower than the height of the piezoelectric ceramic 1 are formed on the inner circumferential surface and the outer circumferential surface of the piezoelectric ceramic 1 wound like the coil, the actuator having the same effect can be obtained.

Figure 17:
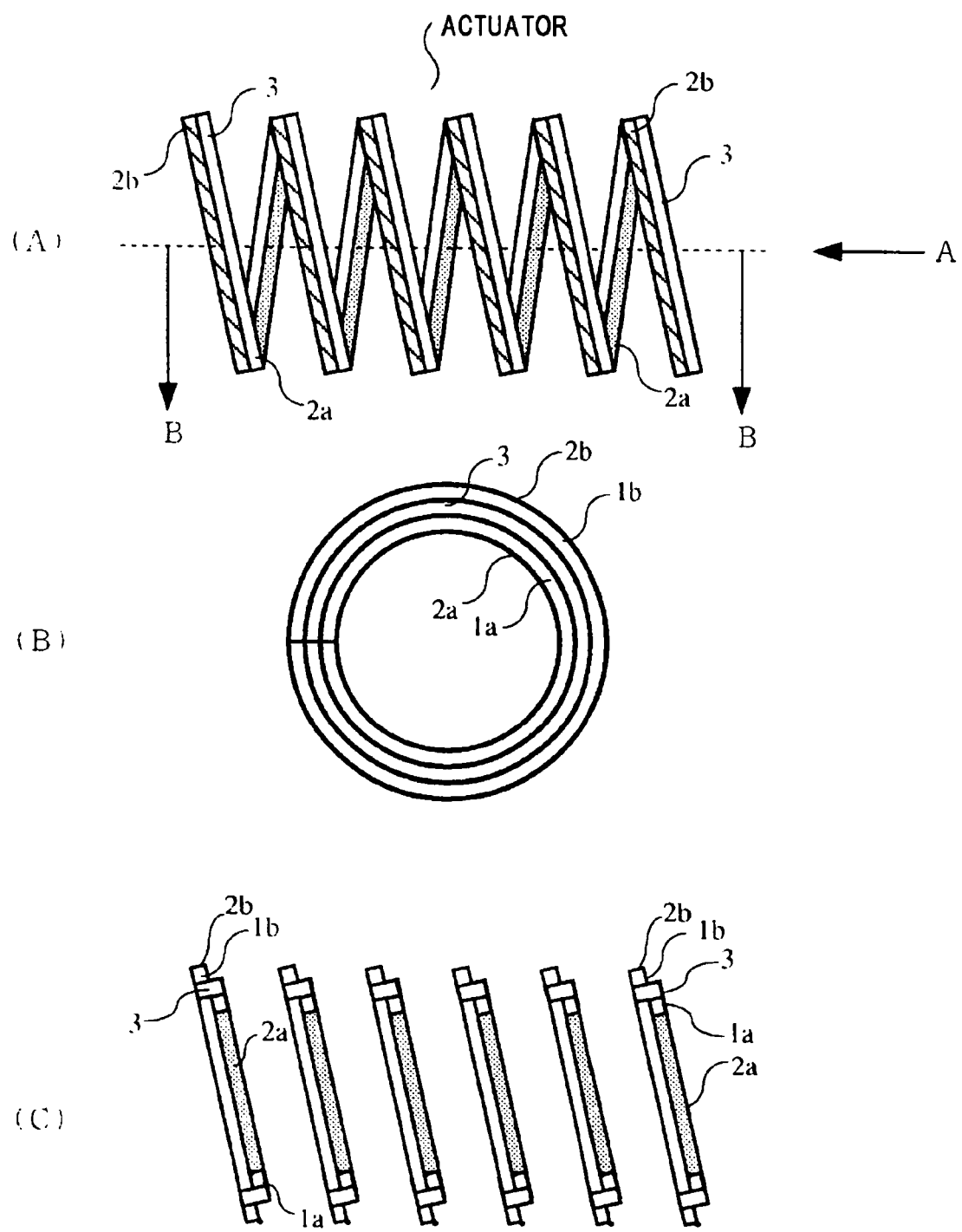
FIGS. 17A to 17C are views showing an actuator of another embodiment of the present invention.

Besides, in the actuator shown in FIGS. 14A to 14D, although the piezoelectric ceramics 1a and 1b narrower than the width of the metal coil 3, and the electrodes 2a and 2b are formed on the upper surface and the lower surface of the metal coil 3, as shown in FIGS. 17A to 17C, even if the piezoelectric ceramics 1a and 1b lower than the metal coil 3 and the electrodes 2a and 2b are formed on the inner circumferential surface and the outer circumferential surface of the metal coil 3, the actuator having the same effect can be obtained.

Figure 18:
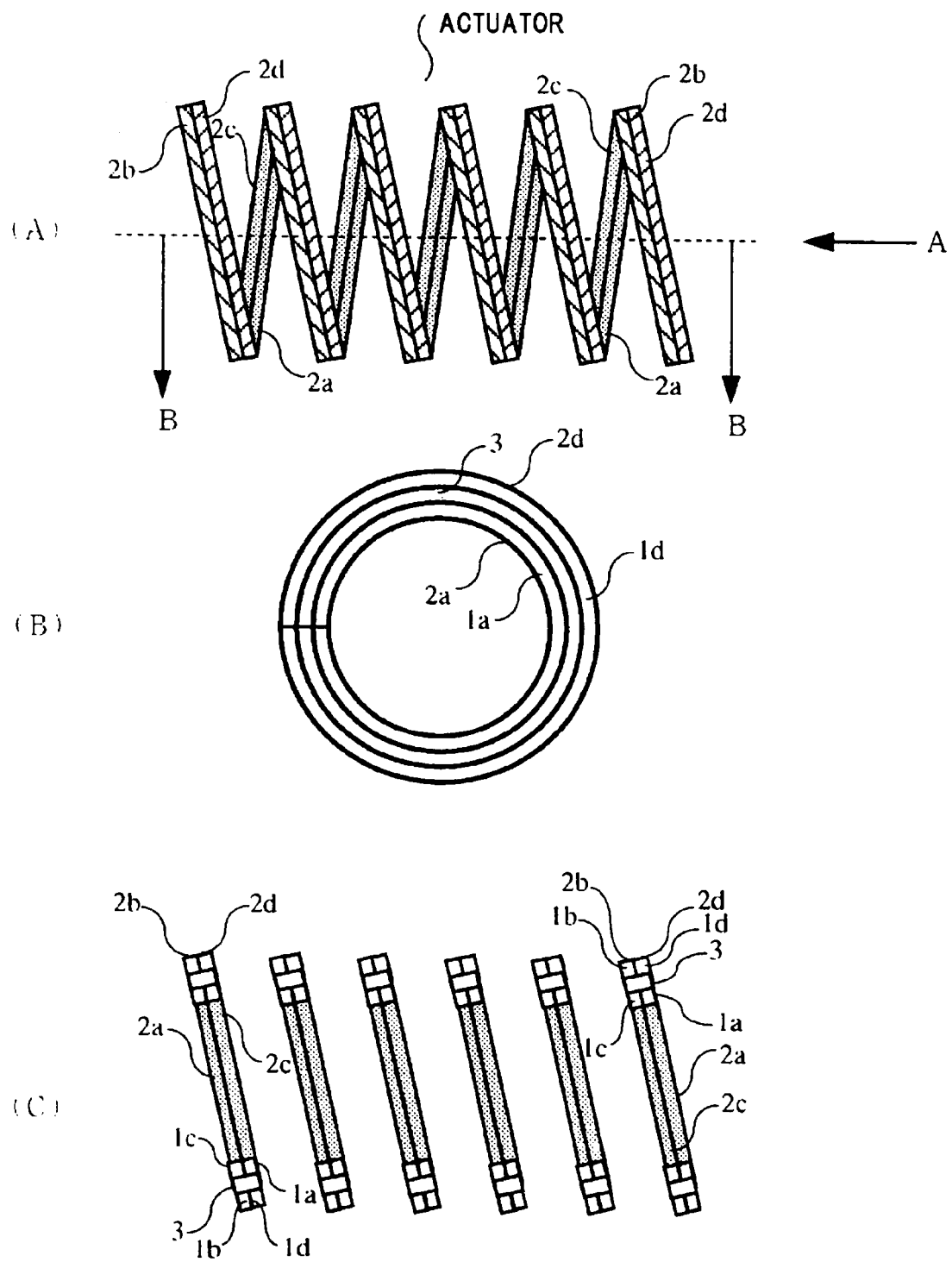
FIGS. 18A to 18C are views showing an actuator of another embodiment of the present invention.

Further, in the actuator shown in FIGS. 15A to 15D, although the piezoelectric ceramics 1a to 1d narrower than the width of the metal coil 3 and the electrodes 2a to 2d are formed on the upper surface and the lower surface of the metal coil 3, as shown in FIGS. 18A to 18C, even if the piezoelectric ceramics 1a to 1d lower than the height of the metal coil 3 and the electrodes 2a to 2d are formed on the inner circumferential surface and the outer circumferential surface of the metal coil 3, the actuator having the same effect can be obtained.

Since the actuator of the embodiment is displaced in the axial direction, it is conceivable that the actuator is used for, for example, a suspension spring of an automobile or the like. In the actuator using the piezoelectric ceramic 1, as well known, the sensing of vibration and the attenuation of vibration by application control of voltage can be electrically controlled, it is said that flexible control can be carried out. Besides, since an oil damper becomes unnecessary, the cost of the automobile to which the actuator is applied can be greatly reduced.

Besides, in an adjustment structure of a fuel injection device valve used for an automobile or the like, the above actuator may be used for a driving mechanism portion of a needle.

Besides, in all the foregoing embodiments, the shape of the piezoelectric ceramic 1 or the metal coil 3 may be formed into a shape shown in FIG. 19A or FIG. 19B. The shape shown in FIG. 19A or 19B is a shape generally called a bamboo spring, and is a spring shape in which a large displacement is obtained in the axial direction. FIGS. 19A and 19B show sections of the bamboo springs.

Figure 20:
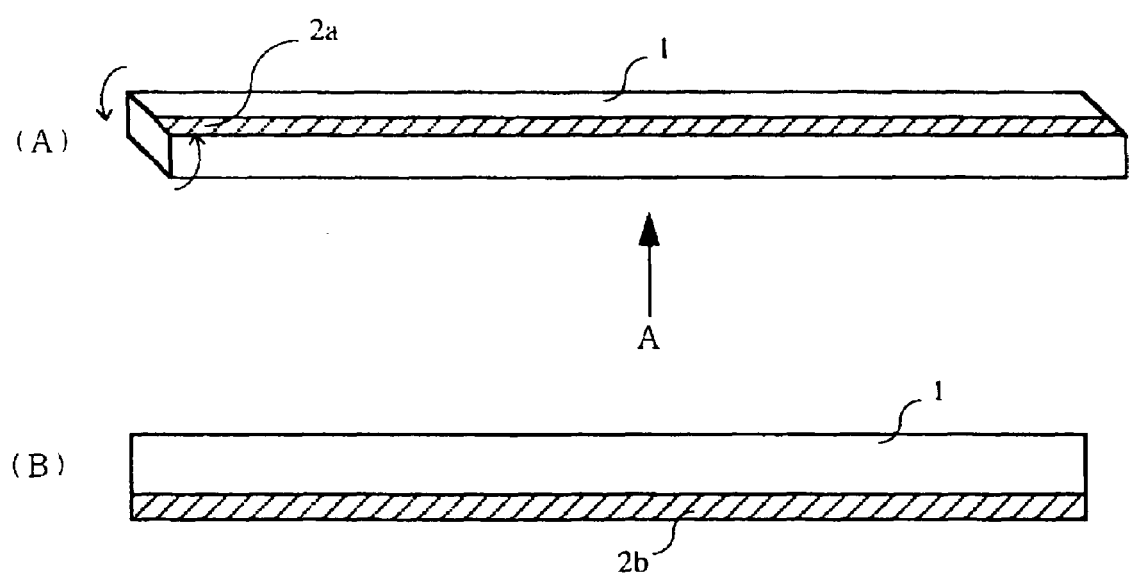
FIGS. 20A and 20B are views showing an actuator of another embodiment of the present invention.

Next, an actuator of another embodiment of the present invention will be described. FIG. 20A is a view showing the actuator of this embodiment, and FIG. 20B is a view (view seen in a direction "A" shown in FIG. 20A) showing a lower surface of the actuator. The actuator of this embodiment is such that an electrode 2a having a width not larger than half of the width of a piezoelectric ceramic 1 is formed on an upper surface of the belt-shaped piezoelectric ceramic 1 along one side portion, and an electrode 2b having a width not larger than half of the width of the piezoelectric ceramic 1 is formed on a lower surface of the belt-shaped piezoelectric ceramic 1 along the other side portion. As is apparent from this drawing as well, the actuator of this embodiment is such that the piezoelectric ceramic 1 in the actuator shown in FIGS. 13A to 13D is made belt-shaped (so-called torsion bar).

Figure 21:
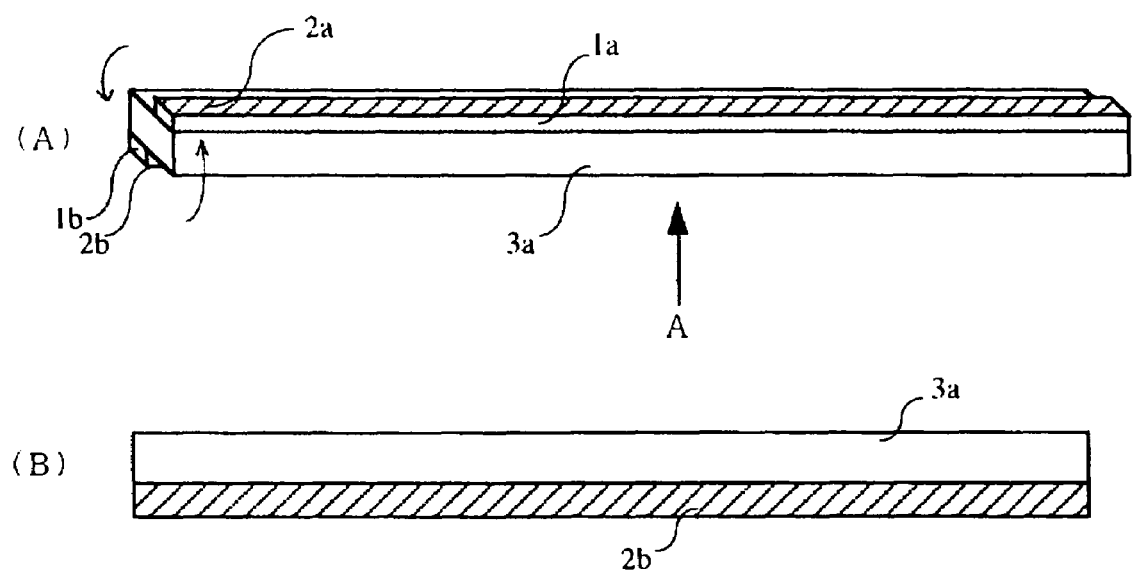
FIGS. 21A and 21B are views showing an actuator of another embodiment of the present invention.
Figure 22:
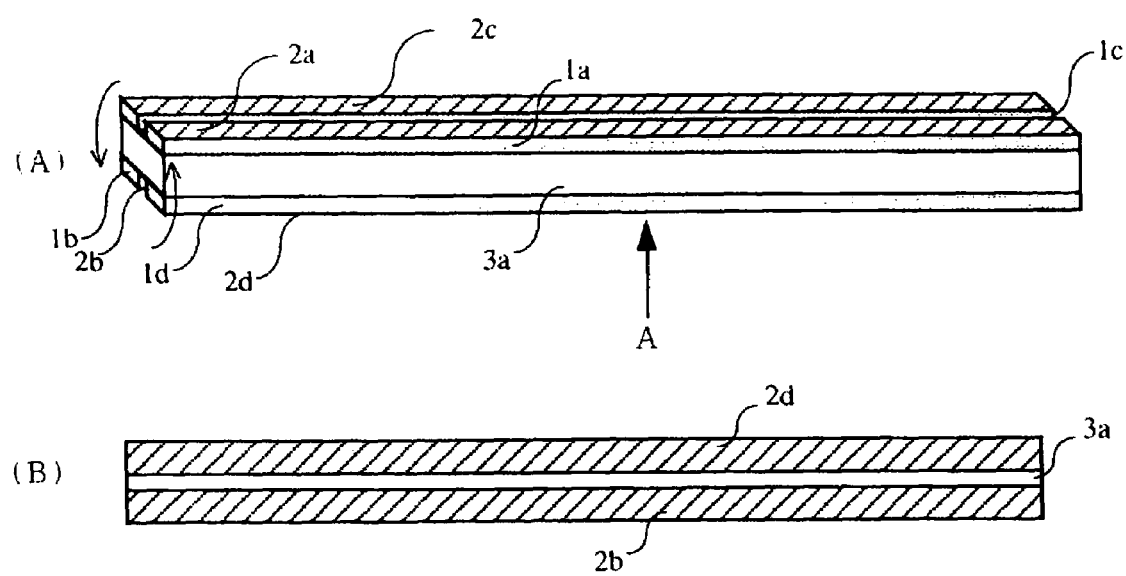
FIGS. 22A and 22B are views showing an actuator of another embodiment of the present invention.

Besides, as another embodiment of this torsion bar type actuator, ones shown in FIGS. 21A and 21B and FIGS. 22A and 22B are conceivable. FIGS. 21A and 21B show the actuator in which the metal coil 3 of the actuator shown in FIGS. 14A to 14D is replaced by a belt-shaped metal plate 3a, and FIGS. 22A and 22B show the actuator in which the metal coil 3 of the actuator shown in FIGS. 15A to 15D is replaced by a belt-shaped metal plate 3a.

The actuators shown in FIGS. 20A to 22B can be manufactured by substantially the same processes as the actuators shown in FIGS. 13A to 15D, respectively.

Incidentally, although FIGS. 22A and 22B show the actuator in which two piezoelectric ceramics 1a to 1d are formed side by side on both the surfaces of the metal plate 3a, two piezoelectric ceramics 1 may be formed on only one of the surfaces.

Next, the operation of these actuators will be described. In the actuators shown in FIGS. 20A to 22B, when voltage is applied between the electrodes 2a and 2b (FIGS. 20A and 20B), between the electrodes 2a, 2b and the metal plate 3a (FIGS. 21A and 21B), and between the electrodes 2a to 2d and the metal plate 3a (FIGS. 22A and 22B), distortion is generated in the direction shown in the drawing.

Figure 23:
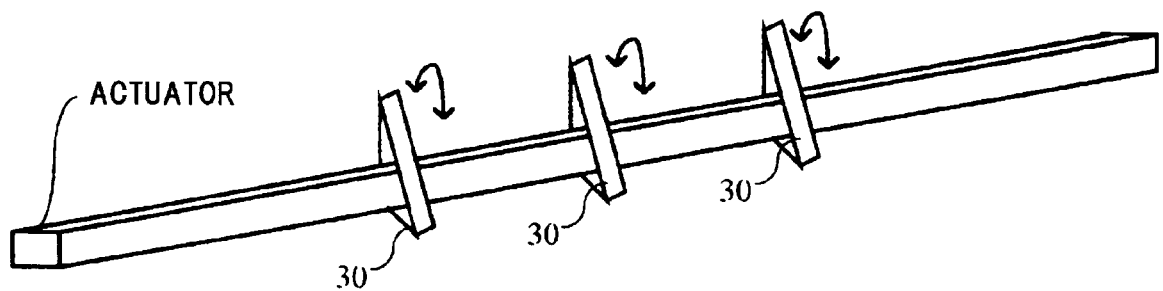
FIG. 23 is a view showing an applied example of an actuator of an embodiment of the present invention.

As a use example of the actuators shown in FIGS. 20A to 22B, as shown in FIG. 23, an example is conceivable in which flappers 30 are attached to the actuator, and the flappers 30 are rotated in the directions shown in the drawing by the distortion generated by application control of voltage.

Further, an actuator of another embodiment of the present invention will be described. FIGS. 24A and 24B are views showing the actuator of this embodiment. FIG. 24A is a top view, and FIG. 24B is a sectional view taken in a direction A—A shown in FIG. 24A. In the actuator of this embodiment, the coil-shaped actuator shown in FIGS. 1A to 1C or FIGS. 5A to 5C is made spring-shaped. Incidentally, reference numeral 35 in the drawing designates a shaft attached to the center of a piezoelectric ceramic 1 or a metal coil 3 wound into a spiral shape (spring shape).

Incidentally, FIG. 25A is a view showing a structure of a portion B shown in FIG. 24B with respect to the actuator in which the actuator shown in FIGS. 1A to 1C is made spring-shaped, and FIG. 25B is a view showing a structure of the portion B shown in FIG. 24B with respect to the actuator in which the actuator shown in FIGS. 5A to 5C is made spring-shaped.

Besides, the actuator of this embodiment can be manufactured by substantially the same method as the actuator shown in FIGS. 1A to 1C or FIGS. 5A to 5C. The description of the manufacturing process is omitted here.

Incidentally, the actuator can not be manufactured by the methods shown in FIGS. 2A to 2E and FIGS. 3A to 3E.

The actuator of this embodiment is displaced in the direction in which a coil diameter is contracted in a spirally wound coil portion when voltage is applied between the electrodes 2a and 2b or between the electrodes 2a, 2b and the metal coil 3. The shaft 35 provided at the center of the coil is rotated by this displacement.

Figure 26:
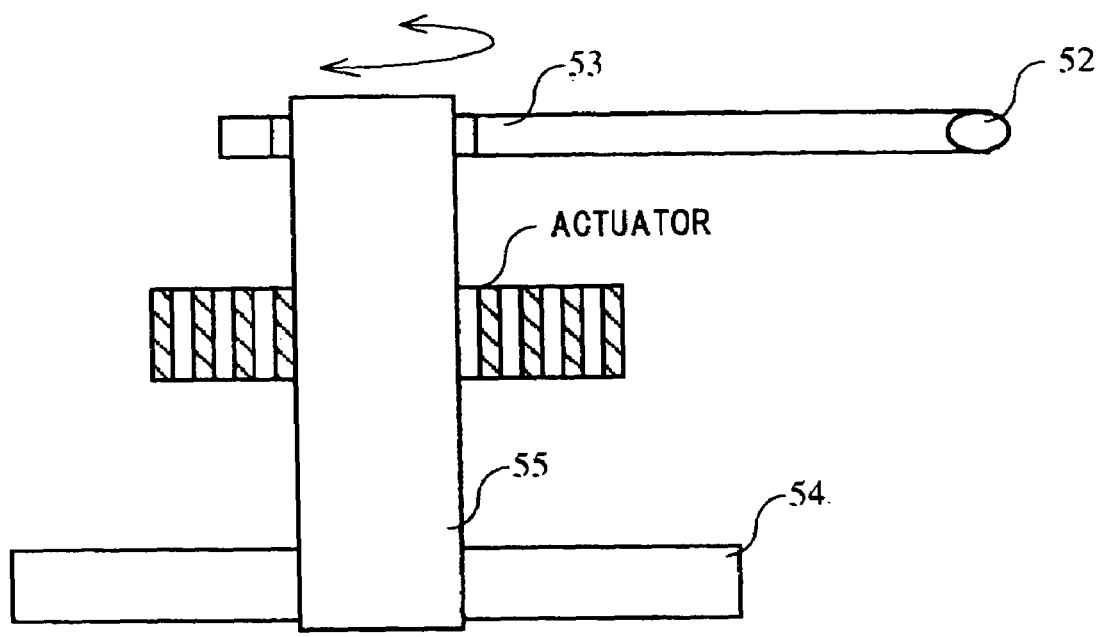
FIG. 26 is a view showing an applied example of an actuator of an embodiment of the present invention.

The actuator of this embodiment can be applied to the rotation driving of the head in the hard disk device shown in FIG. 11. FIG. 26 is a view showing a structure of a head driving portion for moving a head in a radius direction of a disk. The coil-shaped actuator of the embodiment is applied to the head driving portion. A rotating shaft 55 rotatably attached to a base 54 is inserted in the actuator of this embodiment. An inner diameter of the actuator is larger than an outer diameter of the rotating shaft 55. One end portion of the actuator is fixed to the rotating shaft 55, and the other end portion is free.

Incidentally, a lever 53 is fixed to the rotating shaft 55.

As described above, when voltage is applied between the electrodes 2a, 2b and the metal coil 3 of the actuator, the actuator is deformed in the direction in which the inner diameter becomes small. The rotating shaft 55 is rotated by the displacement of this actuator. The lever 53 is rotated in accordance with the rotation of this rotating shaft 55, and a magnetic head 52 is moved in the radius direction of a disk 51. Accordingly, by adjusting the voltage applied between the electrodes 2a, 2b and the metal coil 3 of the actuator to control the displacement amount of the actuator, the magnetic head 52 can be moved to a suitable position with respect to the disk 51.

As stated above, since the structure of the driving mechanism portion for driving the magnetic head 52 becomes simple, miniaturization and reduction in weight of an apparatus main body can be realized. Besides, since the piezoelectric ceramic has a very small time constant, an access time to the disk 51 can be shortened. Besides, since the consumed electric power of the piezoelectric ceramic is small, the consumed electric power of the apparatus main body can be reduced. Further, since positioning control of the magnetic head 52 can be carried out by voltage control, a circuit structure for operating the driving mechanism portion can be made simple, and the cost of the main body can be reduced.

Further, if a spring used for various appliances, for example, a watch is replaced by this actuator, when it is wound, energy is mechanically stored and electricity can be generated. Further, as described later, if the piezoelectric spring is made to have a laminate structure, and a part is formed as a capacitor, storage of an electric charge becomes possible, and electricity can be generated even at the time of unwinding the spring.

As stated above, by using the spring-shaped actuator which can generate and store energy, miniaturization of various appliances, such as a watch, and reduction in cost can be realized.

Figure 27:
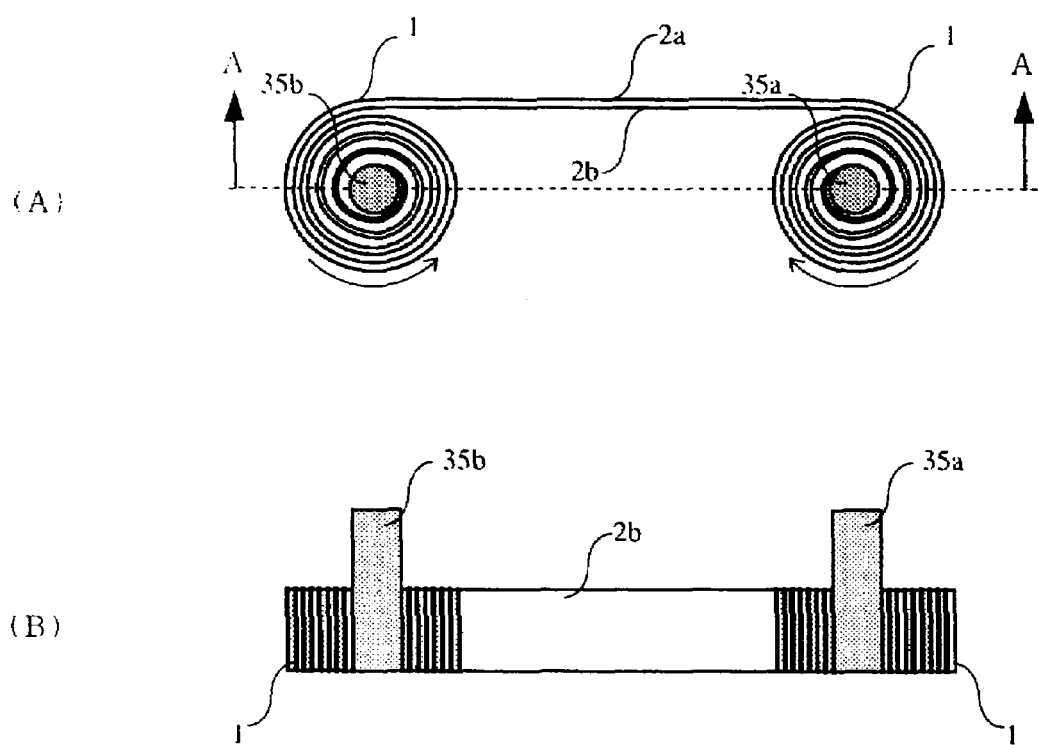
FIGS. 27A and 27B are views showing an actuator of another embodiment of the present invention.

Besides, as shown in FIGS. 27A and 27B, both end portions may be wound into a spiral shape. When voltage is applied between the electrodes 2a and 2b or between the electrodes 2a, 2b and the metal coil 3, the actuator shown in FIGS. 27A and 27B is displaced in the direction to reduce the coil diameter at coil portions of both the end portions, so that two shafts 35a and 35b are rotated in reverse directions to each other.

Next, an embodiment of an actuator in which a dielectric is provided in parallel with a piezoelectric ceramic 1 will be described. Incidentally, in any actuator of the foregoing embodiments, if the dielectric is provided in parallel with the piezoelectric ceramic 1 (1a to 1d), effects set forth below can be obtained.

Figure 28:
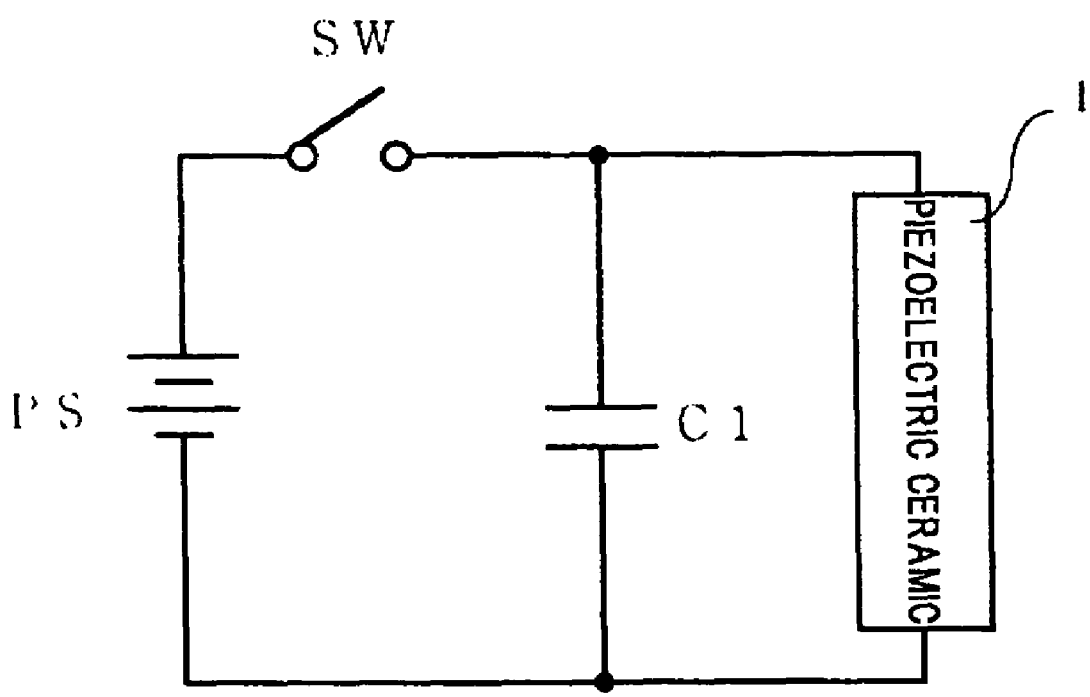
FIG. 28 is a view showing an equivalent circuit of an actuator of another embodiment of the present invention.

As well known, the dielectric functions as a capacitor. FIG. 28 shows a circuit in which a capacitor C1 is connected in parallel with the piezoelectric ceramic 1. Incidentally, in this drawing, PS designates a power source, and SW designates a switch for controlling (on/off) the application of voltage to the piezoelectric ceramic 1.

In the circuit shown in FIG. 28, when the switch SW is turned on, voltage is applied to the piezoelectric ceramic 1, and the actuator is displaced as described above. When the switch SW is turned off, since an electric charge is stored in the capacitor C1, the state in which voltage is applied continues in the piezoelectric ceramic 1, and the actuator is not returned to the initial state. As stated above, the return of the actuator to the initial state can be restricted by the capacitor (dielectric) provided in parallel with the piezoelectric ceramic (1a to 1d). Besides, if the capacitance of the capacitor C1 is adjusted, it is possible to control a time from the point when the switch SW is turned off to the point when the actuator starts to return to the initial state. Besides, if a discharge circuit for discharging the electric charge stored in the capacitor C1 is provided, by adjusting the time constant of the discharge circuit, it is also possible to control a time from the point when the switch SW is turned off to the point when the actuator is returned to the initial state, and to carry out speed control at the time of returning.

The capacitor C1 may be provided in the switching circuit for controlling the operation of the actuator, or may be formed integrally with the actuator.

Hereinafter, a manufacturing process of an actuator in which the capacitor C1 is integrally formed, will be described. A step of forming the piezoelectric ceramic 1 (1a to 1d) on the metal coil 3 or the metal plate 3a, and steps up to the formation of the electrode 2 (2a to 2d) on the surface of the piezoelectric ceramic 1 are the same as the steps in the foregoing manufacturing process of the actuator. Here, for facilitation of explanation, an actuator is exemplified in which the piezoelectric ceramic 1 is formed on the upper surface of the belt-shaped metal plate 3a and the electrode 2 is formed on the surface of the piezoelectric ceramic 1, and steps subsequent to this will be described.

FIG. 29A shows a state where the piezoelectric ceramic 1 and the electrode 2 are formed on the metal plate 3, and a polarization treatment is not performed. Here, a part (portion surrounded by a broken line in the drawing) of the piezoelectric ceramic 1 and the electrode 2 is cut off from another part to make a state where electrical connection is not made (see FIG. 29B). The polarization treatment is not performed for the cut off part, and the polarization treatment is performed for the other part. That is, high voltage is not applied to the cut off part. When the polarization treatment is completed, aging is performed, and after the aging is completed, an electrode 5 for electrically connecting the cut off part to the part subjected to the polarization treatment is formed (see FIG. 29C).

In the actuator manufactured by the above steps, when voltage is applied between the electrode 2 and the metal plate 3, although the piezoelectric inverse effect does not occur in the part which has not been subjected to the polarization treatment, the piezoelectric inverse effect occurs in the part which has been subjected to the polarization treatment, so that a designated displacement is generated. On the other hand, since the piezoelectric ceramic 1 is originally a dielectric, it functions as a capacitor. Accordingly, the part which has not been subjected to the polarization treatment functions as the capacitor C1 shown in FIG. 28. As stated above, by merely changing the manufacturing process of the actuator slightly, it is possible to manufacture the actuator in which the dielectric is connected in parallel with the piezoelectric ceramic 1. Of course, the capacitor C1 may be formed by another material superior in dielectric properties.

Figure 30:
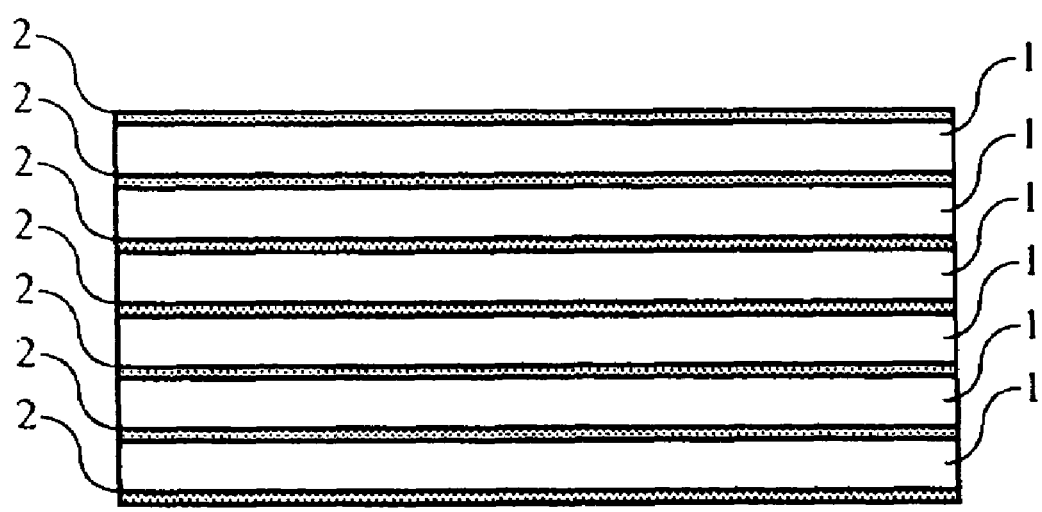
FIG. 30 is a view showing a laminated piezoelectric ceramic.

Further, the piezoelectric ceramic 1 used for all the embodiments may be a laminate type. The laminate type piezoelectric ceramic 1 is such that a plurality of piezoelectric ceramics 1 are laminated while electrodes 2 are interposed between them as shown in FIG. 30.

Incidentally, the electrode 2 is formed not only between the layers of the piezoelectric ceramics 1, but also on the obverse and reverse surfaces of the actuator.

In a bimorph type piezoelectric element, as the thickness becomes thin, the displacement becomes large, however, the force generated by the displacement becomes small. However, a large force can be generated by laminating a plurality of piezoelectric elements, and a large displacement can also be obtained, so that the actuator can be constructed to be further small. Besides, a portion between laminate layers of the laminated piezoelectric ceramics 1 may be an adhering type or may be a non-adhering type.

Figure 31:
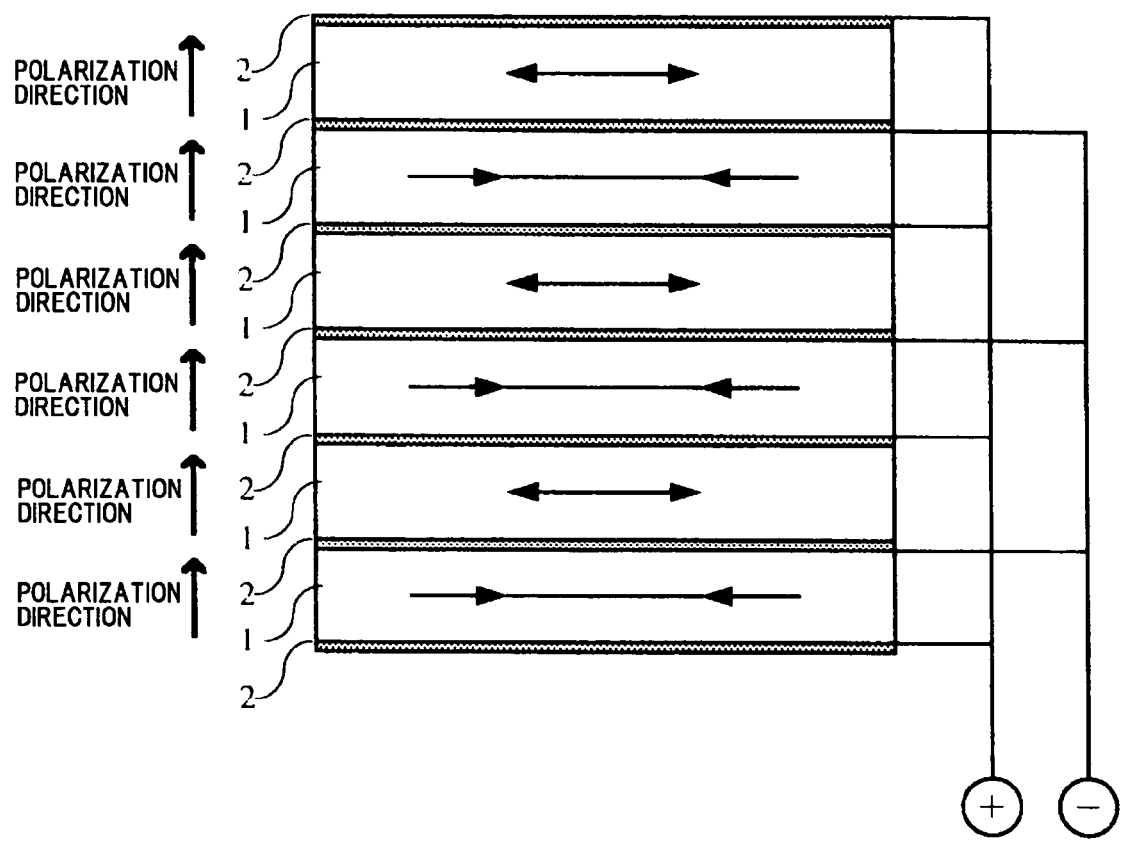
FIG. 31 is a view showing a laminated piezoelectric ceramic.

In the laminate type actuator, for example, as shown in FIG. 31, six piezoelectric ceramics 1 each having the polarization direction of an upward direction are superimposed on each other while the electrodes 2 are interposed between them. In the case where the electrodes 2 on the obverse and reverse surfaces and between the layers are made alternately a positive electrode and a negative electrode and voltage is applied, in the piezoelectric ceramics 1 of the respective layers, the expanding and contracting directions of the piezoelectric ceramics 1, which are vertically positioned while the electrodes 2 are interposed between them, alternately become opposite to each other. In this case, the vertically positioned piezoelectric ceramics 1 are deformed in the opposite directions to each other. Thus, the friction generated between the respective layers acts in the direction to prevent the deformation of the piezoelectric ceramic 1, and the generated force is decreased by this.

Then, as shown in FIG. 32A, the lamination is carried out so that the polarization directions of the piezoelectric ceramics 1 positioned vertically at both sides of the electrode 2 become opposite to each other. Besides, the respective electrodes 2 are connected as shown in the drawing, and voltage is applied so that the piezoelectric ceramics 1 of the upper three layers are deformed in the expanding direction, and the piezoelectric ceramics 1 of the lower three layers are deformed in the contracting direction.

In a method shown in FIG. 32A, voltage is not applied to the electrode positioned between the upper three layers and the lower three layers. Positive voltage and negative voltage are alternately applied to the other electrodes 2.

In this case, there is one place where the piezoelectric ceramics 1 deforming in the opposite directions are vertically positioned (there are five places in the actuator shown in FIG. 31). Thus, as compared with the actuator shown in FIG. 31, a force acting in the direction to prevent the displacement of the piezoelectric ceramic 1 can be suppressed, and a larger force can be generated.

Besides, the actuator shown in FIG. 32A can be easily manufactured as described below.

When the piezoelectric ceramics 1 are formed by the hydrothermal synthesis on the obverse and reverse surfaces of a titanium base member functioning as the electrode 2, the polarization directions of the piezoelectric ceramics 1 formed on the observe and reverse surfaces of the electrode 2 (titanium base member) become directions directed toward the electrode 2 (see FIG. 32B). Accordingly, by superimposing three such product (the product shown in FIG. 32B) in each of which the piezoelectric ceramics 1 are formed by the hydrothermal synthesis on the obverse and reverse surfaces of the electrode 2 (titanium base member), the actuator shown in FIG. 32A can be manufactured.

Besides, with respect to the intermediately disposed product, the electrode 2 may not be formed on the obverse and reverse surfaces of the formed piezoelectric ceramic 1. It is sufficient if the electrode 2 is formed on the obverse and reverse surfaces of the formed piezoelectric ceramic 1 only with respect to the products disposed at the upper side and the lower side. The reason is that the intermediately disposed product can share the electrodes 2 formed on the products disposed at the upper side and the lower side.

Figure 33:
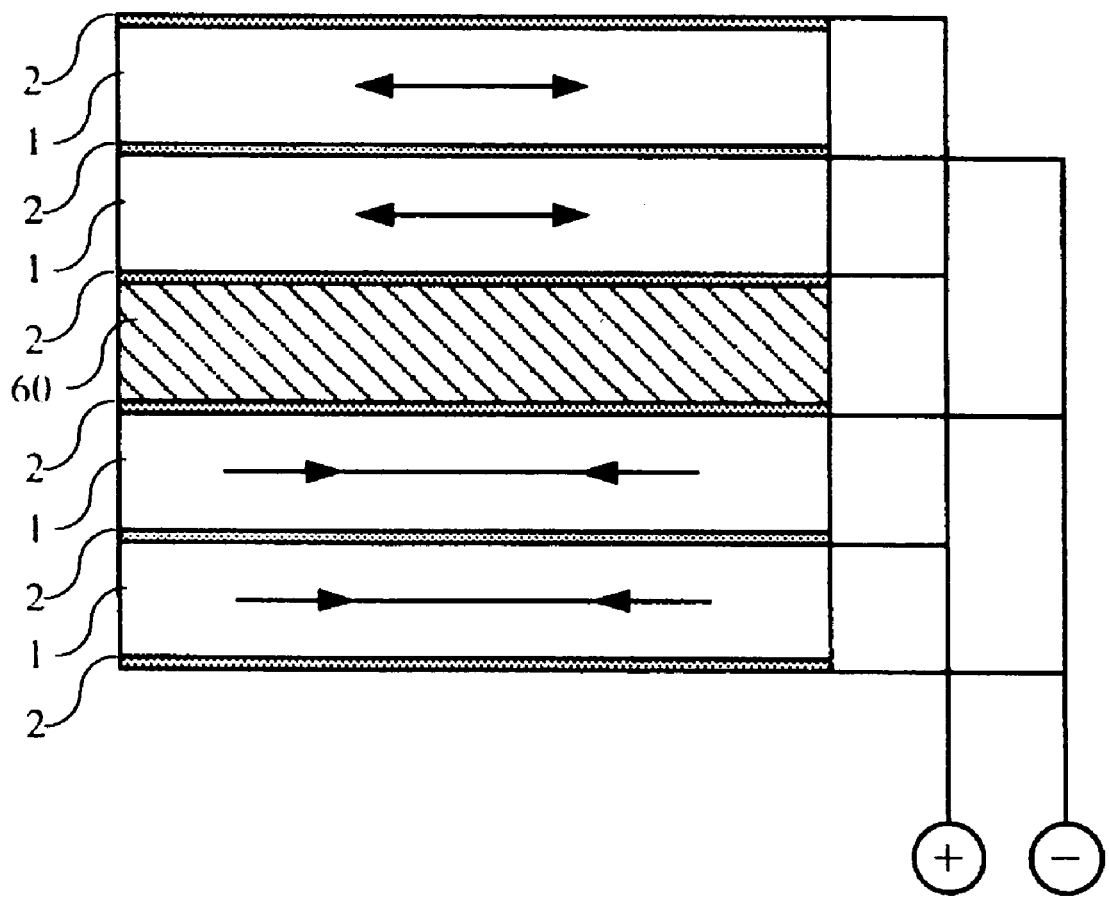
FIG. 33 is a view showing a laminated piezoelectric ceramic.

Besides, as shown in FIG. 33, the product shown in FIG. 32B may be disposed at the upper and lower sides of a capacitor 60 made of a dielectric layer. In this case, even if electrification is stopped by cutting off a power supply circuit, since an electric charge is held in the capacitor 60 (dielectric), the displacement can be held for a definite time. Although the piezoelectric ceramic 1 is originally a dielectric material and is polarized and charged by electrification, since its internal resistance is not infinite, the piezoelectric ceramic discharges the electricity in a time corresponding to the internal resistance value, and the deformation of the actuator is returned. If a dielectric member superior in charging efficiency is disposed at a place where a contribution effect to a displacement operation is low, the holding effect of the displacement becomes more remarkable.

As described above, according to the present invention, the structure is simple, and the manufacturing process does not include a troublesome step, so that the manufacturing cost is low. Besides, since the actuator itself is small, the miniaturization of an apparatus to which this actuator is applied and the reduction in cost can be easily realized.

Besides, according to the present invention, a strain element formed into a coil shape or a spring shape can be easily manufactured.

What is claimed is:

1. A method of manufacturing a strain element, comprising the steps of:
   forming a coating film of titanium or a titanium compound on a surface of a cylindrical mold;
   shaping the coating film, which has been formed on the surface of the cylindrical mold, into a coil;
   forming a crystal film of a strain element having a property of a piezoelectric inverse effect by hydrothermal synthesis on the coating film shaped into the coil; and
   removing the strain element from the cylindrical mold.

2. A method of manufacturing the strain element according to claim 1, further comprising the step of forming the crystal film of the strain element having the property of the piezoelectric inverse effect by the hydrothermal synthesis on an inner circumferential surface of the strain element removed from the cylindrical mold.

3. A method of manufacturing the strain element according to claim 2, further comprising:
   the step of forming the coating film of titanium or the titanium compound on an outer circumferential surface of the strain element removed from the cylindrical mold; and
   forming the crystal film of the strain element having the property of the piezoelectric inverse effect by the hydrothermal synthesis on the coating film formed on the outer circumferential surface of the strain element.

4. A method of manufacturing the strain element according to claim 1, further comprising:
   the step of forming the coating film of titanium or the titanium compound on an outer circumferential surface of the strain element removed from the cylindrical mold; and
   forming the crystal film of the strain element having the property of the piezoelectric inverse effect by the hydrothermal synthesis on the coating film formed on the outer circumferential surface of the strain element.

* * * * *